US007561081B2

(12) United States Patent
Krimerman et al.

(10) Patent No.: US 7,561,081 B2
(45) Date of Patent: Jul. 14, 2009

(54) METHOD AND APPARATUS FOR OPTIMIZATION OF SIGCOMP UDVM PERFORMANCE

(75) Inventors: Michael Krimerman, Ein-Vered (IL); Igor Malamant, Haifa (IL); Noa Rubens Grinblat, Haifa (IL)

(73) Assignee: Qualcomm Incorporated, San Diego, CA (US)

( * ) Notice: Subject to any disclaimer, the term of this patent is extended or adjusted under 35 U.S.C. 154(b) by 36 days.

(21) Appl. No.: 11/776,374

(22) Filed: Jul. 11, 2007

(65) Prior Publication Data

US 2008/0204283 A1 Aug. 28, 2008

Related U.S. Application Data

(60) Provisional application No. 60/830,545, filed on Jul. 12, 2006.

(51) Int. Cl.
*H03M 7/00* (2006.01)
*H04L 12/66* (2006.01)

(52) U.S. Cl. ........................ 341/106; 370/352; 455/428

(58) Field of Classification Search .................. 341/50, 341/51, 106; 370/352, 236, 392; 455/428; 709/246
See application file for complete search history.

(56) References Cited

U.S. PATENT DOCUMENTS

2005/0172032 A1* 8/2005 Pessi .......................... 709/246
2007/0140125 A1* 6/2007 Pessi .......................... 370/236
2008/0112411 A1* 5/2008 Stafford et al. .............. 370/392

OTHER PUBLICATIONS

Price, et al. "Signaling Compression (SigComp)" (2003) The Internet Society, 62 pages.

Hannu, et al. "Signaling Compression (SigComp)—Extended Operations" (2003) The Internet Society, 19 pages.

Garcia-Martin, et al. "The Session Initializing Protocol (SIP) and Session Description on Protocol (SDP) Static Dictionary for Signaling Compression (SigComp)" (2003) The Internet Society, 30 pages.

Camarillo. "Compressing the Session Initializing Protocol (SIP)" (2003) The Internet Society.

Deutsch. "Deflate Compressed Data Format Specification version 103" (1996) 15 pages.

Rosenberg, et al. "SIP: Session Initiation Protocol" (2002) The Internet Society, 269 pages.

Roach, et al. "A Negative Acknowledgement Mechanism for Signaling Compression" (2005) The Internet Society, 16 pages.

Bormann, et al. "Applying Signaling Compression (SigComp) to the Session Initiation Protocol (SIP)" (2006), The INternet Society, 15 pages.

Surtees, et al. "Signaling Compression (SigComp) Corrections and Clarifications" (2007) The IETF Trust.

(Continued)

*Primary Examiner*—Peguy JeanPierre
(74) *Attorney, Agent, or Firm*—Abdollah Katbab; Darren Simon

(57) ABSTRACT

A signal compression optimization system between a communication network and wireless user equipment advantageously selects an optimized decompressor when feasible for reduced content processing latency and otherwise selects a virtual machine decompressor, such as a Universal Decompressor Virtual Machine (UDVM) that interprets the received decompression bytecode. Since the UDVM is not optimized for any particular decompression algorithm and suffers by the requisite delays associated with analyzing each statement in the bytecode before execution, being able to avoid use of the UDVM whenever possible enhances user experience in presenting wirelessly received signaling messages or media content.

43 Claims, 12 Drawing Sheets

OTHER PUBLICATIONS

Siemens, et al. "Signaling Compression (SigComp) Torture Tests" (2006) The Internet Society.

Surtees, et al. "SigComp User's Guide" (2005) The Internet Society.

Maenpaa. "Performance of Signaling Compression in the Third Generation of Mobile Network" (2007) Thesis Paper for the Helsinki University of Technology, 193 pages.

Richard Price et al: "Universal Decompessor Virtual Machine (UDVM); Draft-IETF-ROHC-SIGCOMP_UDVM-00.TXT" IETF Standard-Working-Draft, Internet Engineering Task Force, IETF, CH, vol. ROHC (Jan. 28, 2002).

T. Suganuma et al.: "Overview of the IBM Java Just-in-Time Compiler" IBM Systems Journal, vol. 39, No. 1, 2000, pp. 175-193.

Nordberg M et al: "Improving SigComp Performance Through Extended Operations" Vehicular Technology Conference, 2003. VTC 2003-Fall. 2003 IEEE 58th Orlando, FL, USA Oct. 6-9, 2003; (IEEE Vehicular Technology Conference), Piscataway, NJ, USA, IEEE, US, vol. 5, (Oct. 6, 2003), pp. 3425-3428.

Surtees M West Siemens/Roke Manor Research A: "Signaling Compression (SigComp) Users' Guide; RFC4464.TXT" IETF Standard, Internet Engineering Task Force, IETF, CH, (May 1, 2006), pp. 175-193.

International Search Report-PCT/US07/073318, International Search Authority-European Patent Office-Sep. 4, 2008.

Written Opinion-PCT/US07/073318, International Search Authority-European Patent Office-Sep. 4, 2008.

* cited by examiner

| Static DEFLATE performance | | | | | | | |
|---|---|---|---|---|---|---|---|
| Message "Type" | Direction | Plain Size | Compr. Size | Sent Size | Compr. Time | Decompr. time | Compr./plain |
| REGISTER | UAC-->registrar | 534 | 208 | 520 | 5 | | 0.39 |
| 200 ok | registrar-->UAC | | | | | 11 | |
| INVITE | UAC-->UAS | 894 | 370 | 682 | 7 | 22 | 0.41 |
| 180 ringing | UAS-->UAC | 443 | 177 | 490 | 5 | 8 | 0.40 |
| 200 ok | UAS-->UAC | 804 | 356 | 669 | 8 | 16 | 0.44 |
| ACK | UAC-->UAS | 496 | 193 | 201 | 5 | 12 | 0.39 |

SIZE IN BYTES
TIME IN MILLISECONDS

FIG. 12

| LZSS performance | | | | | | | |
|---|---|---|---|---|---|---|---|
| Message "Type" | Direction | Plain Size | Compr. Size | Sent Size | Compr. Time | Decompr. time | compr./plain |
| REGISTER | UAC-->registrar | 533 | 215 | 405 | 4 | | 0.40 |
| 200 ok | registrar-->UAC | | | | | 11 | |
| INVITE | UAC-->UAS | 894 | 394 | 584 | 5 | 11 | 0.44 |
| 180 ringing | UAS-->UAC | 443 | 183 | 381 | 3 | 5 | 0.41 |
| 200 ok | UAS-->UAC | 804 | 369 | 567 | 6 | 10 | 0.46 |
| ACK | UAC-->UAS | 496 | 200 | 219 | 4 | 5 | 0.40 |
| BYE | UAC-->UAS | 438 | 194 | 213 | 3 | 7 | 0.44 |
| 200 ok | UAS-->UAC | 391 | 179 | 198 | 3 | 5 | 0.46 |

SIZE IN BYTES
TIME IN MILLISECONDS

FIG. 13

METHOD AND APPARATUS FOR OPTIMIZATION OF SIGCOMP UDVM PERFORMANCE

CLAIM OF PRIORITY UNDER 35 U.S.C. §119

The present Application for Patent claims priority to Provisional Application No. 60/830,545 entitled "Method and Apparatus for Optimization of SigComp UDVM Performance" filed 12 Jul. 2006, and assigned to the assignee hereof and hereby expressly incorporated by reference herein.

BACKGROUND

This invention relates to compression methods for wireless communication.

Session Initiation Protocol (SIP) is the protocol used for call control in the third generation mobile network starting from the Third Generation Partnership Project (3GPP) release 5. SIP uses textual encoding, which makes it easier to build services based on SIP, design extensions to SIP and debug the protocol. However, the textual encoding of SIP also has a serious drawback; it is well known that SIP messages are considerably larger than those of the protocols used for instance in Global System for Mobile communication (GSM) call control. Large message sizes result in increased call setup delay because more data needs to be transmitted over the low-bandwidth radio interface. This observation created a need to develop a solution which could reduce the call setup time. One such solution is the Signaling Compression (SigComp) protocol designed by the Internet Engineering Task Force (IETF). SigComp provides a framework for the compression of application-layer signaling between two network elements. The central piece of SigComp architecture is the Universal Decompressor Virtual Machine (UDVM), which is a virtual machine optimized for running decompression algorithms. Because of the UDVM, SigComp can support a wide range of compression algorithms instead of dictating a single algorithm to be supported by all SigComp endpoints.

SigComp is a mandatory part of the 3GPP release 5 IP Multimedia Subsystem (IMS). It is applied over the interface between a terminal and Proxy Call Session Control Function (P-CSCF), which is the first contact point for the terminal within the IMS. SigComp improves the quality of service the user perceives by reducing the idle time at call setup. It also allows the network to support a greater number of users by reducing the amount of resources consumed per subscriber.

The primary target for SigComp is cellular systems, where the mobile terminals have varying capabilities and undetected errors may be introduced on the cellular link. SigComp also addresses communication links with limited throughput, including cellular systems.

SUMMARY

The following presents a simplified summary in order to provide a basic understanding of some aspects of the disclosed versions. This summary is not an extensive overview and is intended to neither identify key or critical elements nor delineate the scope of such versions. Its purpose is to present some concepts of the described versions in a simplified form as a prelude to the more detailed description that is presented later.

An aspect provides for communicating data content compressed by one of a number of compression algorithms. Each compression algorithm has a corresponding decompression algorithm capable of reproducing the data content from the compressed data content. In order to give increased flexibility, bytecode sufficient to perform the decompression algorithm is transmitted as part of a data packet protocol along with the compressed data content intended for a decompression virtual machine to interpret the bytecode. In order to enhance user experience by reducing processing time required to interpret the decompressing algorithm, an accessible executable version of the decompression algorithm in machine code associated with the detected bytecode is located and used to decompress the data content rather than using the virtual machine.

In yet another aspect, at least one processor is configured perform the method of decompressing data content by locating an executable version of a decompression source code. In particular, a first module detects the source code. A second module locates an accessible executable version of the decompression algorithm associated with the source code. A third module decompresses the compressed data content utilizing the located accessible executable version of the decompression algorithm.

In an additional aspect, a computer program product has a computer-readable medium containing a first set of codes for causing a computer to detect a source code contained in at least one message. A second set of codes is for causing the computer to locate an accessible executable version of the corresponding decompression algorithm associated with the detected source code. Then, a third set of codes is for causing the computer to decompress the compressed data content utilizing the located accessible executable version of the corresponding decompression algorithm.

In yet another aspect, a means for early compilation of bytecode into machine code provides a very efficient execution of decompression algorithms. For example, using this method with Session Initiation Protocol/Session Description Protocol (SIP/SDP) messages compressed using signal compression (SigComp) would shorten the latency of the processing and call setup times of the message.

In one implementation, a mechanism is provided to avoid executing a Universal Decompression Virtual Machine (UDVM) interpreter for decompression of each SIP/SDP message received. Avoiding execution of the UDVM interpreter reduces the computational requirements on the mobile station and reduces a potential delay in SIP/SDP processing. This approach brings down the call setup/teardown times for SIP-based call flows.

In another aspect, a method for disseminating Internet Protocol (IP) Multimedia Subsystem (IMS) data content to a communication device comprises compressing the IMS data content with a compression algorithm. The method further includes generating a data structure containing a decompression bytecode, and transmitting the compressed IMS data content and decompression bytecode to the communication device. Additionally, the method includes transmitting an executable version of the decompression bytecode to the communication device responsive to a request from the communication device.

In an aspect, at least one processor configured for disseminating Internet Protocol (IP) Multimedia Subsystem (IMS) data content to a communication device comprises a first module for compressing the IMS data content with a compression algorithm. The at least one processor further includes a second module for generating a data structure containing a decompression bytecode, and a third module for transmitting the compressed IMS data content and decompression bytecode to the communication device. Additionally, the at least one processor includes a fourth module for transmitting an executable version of the decompression bytecode to the communication device responsive to a request from the communication device.

In a further aspect, a computer program product comprises a computer readable medium comprising a plurality of sets of codes. A first set of codes is operable to cause a computer to compress Internet Protocol (IP) Multimedia Subsystem (IMS) data content with a compression algorithm. A second set of codes is operable to cause the computer to generate a data structure containing a decompression bytecode. A third set of codes is operable to cause the computer to transmit the compressed IMS data content and decompression bytecode to the communication device. And, a fourth set of codes is operable to cause the computer to transmit an executable version of the decompression bytecode to the communication device responsive to a request from the communication device.

In another aspect, an apparatus for disseminating Internet Protocol (IP) Multimedia Subsystem (IMS) data content to a communication device comprises means for compressing the IMS data content with a compression algorithm. The apparatus also includes means for generating a data structure containing a decompression bytecode, and means for transmitting the compressed IMS data content and decompression bytecode to the communication device. Additionally, the apparatus includes means for transmitting an executable version of the decompression bytecode to the communication device responsive to a request from the communication device.

To the accomplishment of the foregoing and related ends, one or more versions comprise the features hereinafter fully described and particularly pointed out in the claims. The following description and the annexed drawings set forth in detail certain illustrative aspects and are indicative of but a few of the various ways in which the principles of the versions may be employed. Other advantages and novel features will become apparent from the following detailed description when considered in conjunction with the drawings and the disclosed versions are intended to include all such aspects and their equivalents.

BRIEF DESCRIPTION OF THE DRAWINGS

FIG. 12 is a chart depicting Static DEFLATE performance.

FIG. 13 is a chart depicting Lempel-Ziv-Storer-Szymanski (LZSS) compression algorithm performance.

DETAILED DESCRIPTION

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to concisely describing these versions.

The apparatus and methods are especially well suited for use in wireless environments, but may be suited in any type of network environment, including but not limited to, communication networks, public networks, such as the Internet, private networks, such as virtual private networks (VPN), local area networks, wide area networks, long haul networks, or any other type of data communication network.

Figure 1:
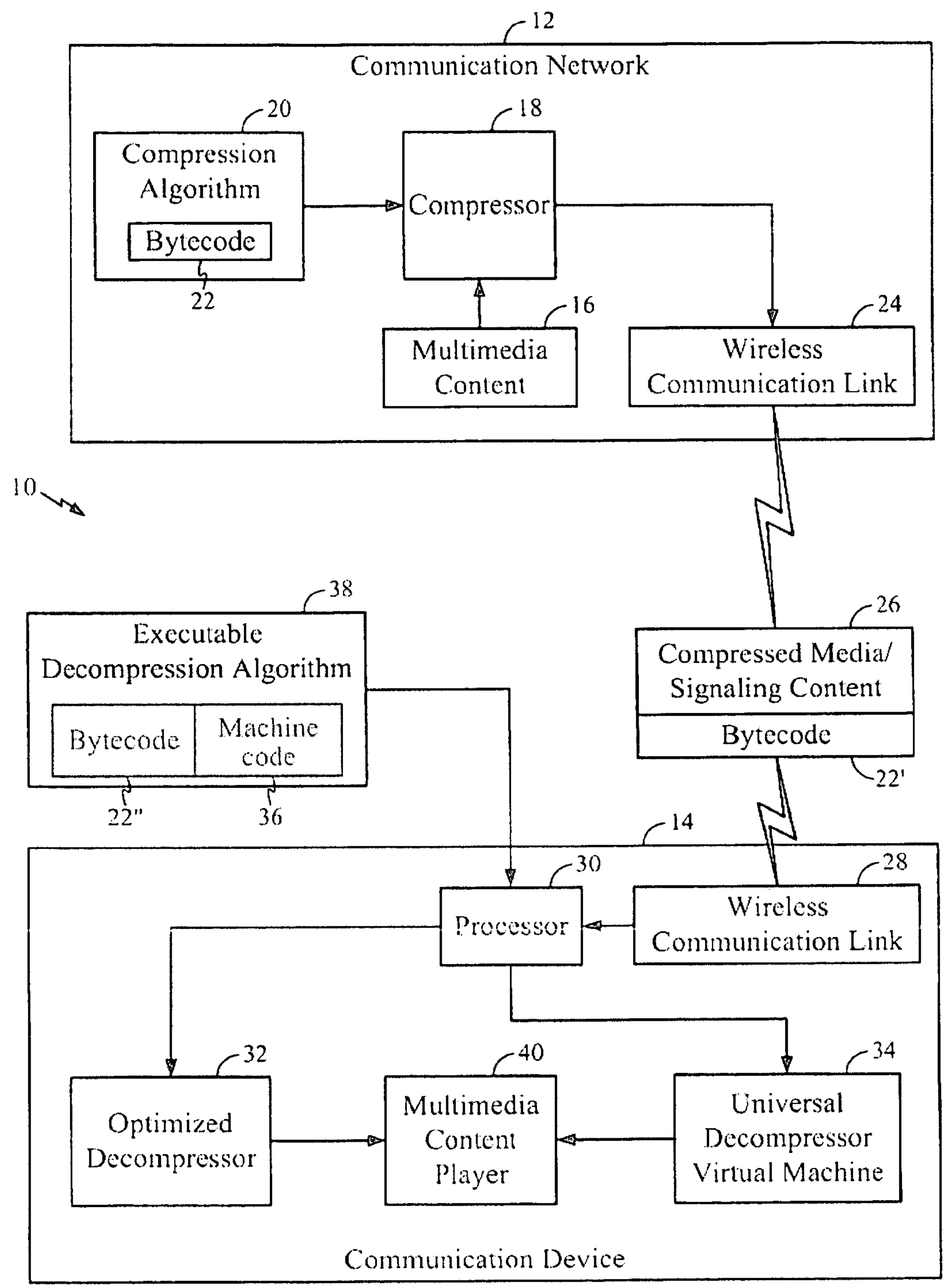
FIG. 1 is a block diagram of a signal compression optimization system for a wireless device in communication with a communication network.

FIG. 1 illustrates one aspect of a signal compression optimization system 10 between a communication network 12 and wireless user equipment (communication device) 14. Within the communication network 12, media or signaling (e.g., audio, image, video, Braille, etc.) (generally “data”) depicted as multimedia content 16 undergoes data compression by a compressor 18 utilizing a data compression algorithm 20. A data decompression bytecode 22 provides source code or bytecode in a form suitable for wireless transmission by a wireless communication link 24 followed by compressed media content 26 to a wireless communication link 28 of the user equipment 14. A processor 30 responsive to the received bytecode 22 advantageously selects an optimized decompressor 32 when convenient for reduced setup latency to avoid in every instance the use of a virtual machine decompressor. Alternatively, the implementation may have instances where an optimized decompressor 32 is not accessible. A processor 30 may then select a virtual machine decompressor, depicted as a Universal Decompressor Virtual Machine (UDVM) 34. The UDVM 34 has a generalized architecture that may flexibly perform a range of decompression algorithms, such as instructed by the received bytecode 22'; however, the UDVM 34 is not optimized for any particular decompression algorithm and suffers by the requisite delays associated with analyzing each statement in the bytecode 22 before execution.

To perform the advantageous avoidance of such execution delays, the processor 30 recognizes that an accessible copy of the bytecode 22" is the same as the received bytecode 22'. Machine code 36 as part of an executable decompression algorithm 38 for performing the bytecode’ is then used by the optimized decompressor 32. The machine code 36 and/or the optimized decompressor are optimized for reduced time for decompression as compared to interpreting source code (i.e., bytecode 22') in a virtual machine. By being able to avoid use of the UDVM 34 whenever possible, the user equipment 14 enhances user experience in presenting the media content 16 on a media content player 38 by avoiding delayed setup.

It should be appreciated with the benefit of the present disclosure that the machine code 36 may be accessed as part of a locally stored library, be compiled locally and stored for future use, be wirelessly accessed from a remote library, be remotely compiled upon request and stored for future use, and/or be provided as firmware or other form of circuitry incorporated into the optimized decompressor. Delays in compiling and/or remotely compiled machine code 36 would be offset by advantages in reduced complexity requirements for the wireless user equipment 14 and on-going decompression efficiencies over a UDVM.

According to some aspects, the communication device 14 may comprise any type of computerized, communication device. For example, as illustrated in FIG. 1, the communication device 14 may comprise a mobile communication device, such as a wireless and/or cellular telephone. Alternatively, the communication device 14 may comprises a fixed communication device, such as a Proxy Call/Session Control Function (P-CSCF) server, a network device, a server, a computer workstation, etc. It should be understood that communication device 14 is not limited to such a described or illustrated devices, but may further include a Personal Digital Assistant (PDA), a two-way text pager, a portable computer having a wired or wireless communication portal, and any type of computer platform having a wired and/or wireless communications portal. Further, the communication device 14 can be a remote-slave or other similar device, such as remote sensors, remote servers, diagnostic tools, data relays, and the like, which does not have an end-user thereof, but which simply communicates data across a wireless or wired network. In alternate aspects, the communication device 14 may be a wired communication device, such as a landline telephone, personal computer, set-top box or the like. Additionally, it should be noted that any combination of any number of communication devices 14 of a single type or a plurality of the afore-mentioned types may be utilized in the system 10. Therefore, the present apparatus and methods can accordingly be performed on any form of wired or wireless device or computer module, including a wired or wireless communication portal, including without limitation, wireless modems, Personal Computer Memory Card International Association (PCMCIA) cards, access terminals, personal computers, telephones, or any combination or sub-combination thereof.

Additionally, the communication device 14 may include a user interface 42 for purposes such as requesting, interacting with, and/or playing the multimedia content 16. This user interface 42 include an input device 44 operable to generate or receive an input into the communication device 14, and an output device 46 operable to generate and/or present information for consumption by the user of the communication device 14. For example, input device 44 may include at least one device such as a keypad and/or keyboard, a mouse, a touch-screen display, a microphone in association with a voice recognition module, etc. In certain aspects, input device 44 may provide for user input of a request for content or for user input of a request for additional information. Further, for example, output device 46 may include a display, an audio speaker, a haptic feedback mechanism, etc. Output device 46 may generate a graphical user interface, a sound, a feeling such as a vibration, etc., and such outputs may be associated, for example, with the presentation of multimedia content 16 (FIG. 1).

Further, communication device 14 may include a computer platform 48 operable to execute applications to provide functionality to the device, and that may further interact with input device 44 and output device 46. Computer platform 48 may include a memory 50, which may comprise volatile and non-volatile memory portions, such as read-only and/or random-access memory (RAM and ROM), erasable programmable read-only memory (EPROM), electrically erasable programmable read-only memory (EEPROM), flash memory, and/or any memory common to computer platforms. Further, memory 50 may include active memory and storage memory, including an electronic file system and any secondary and/or tertiary storage device, such as magnetic media, optical media, tape, soft and/or hard disk, and removable memory components.

Further, computer platform 48 may also include a processor 52, which may be an application-specific integrated circuit (ASIC), or other chipset, processor, logic circuit, or other data processing device. In some aspects, such as when communication device 14 comprises a cellular telephone, processor 52 or other logic such as ASIC may execute an application programming interface (API) layer 54 that interfaces with any resident software components, such as voice call, data call, and media-related applications in memory 50. API 54 may be a runtime environment executing on the respective communication device. One such runtime environment is Binary Runtime Environment for Wireless® (BREW®) software developed by Qualcomm Incorporated of San Diego, Calif. Other runtime environments may be utilized that, for example, operate to control the execution of applications on wireless computing devices.

Additionally, processor 52 may include various processing subsystems 56 embodied in hardware, firmware, software, and combinations thereof, that enable the functionality of communication device 14 and the operability of the communication device on communications network 28 (FIG. 1). For example, processing subsystems 56 allow for initiating and maintaining communications, and exchanging data, with other networked devices as well as within and/or among components of communication device 14. In one aspect, such as in a cellular telephone, processor 52 may include one or a combination of processing subsystems 56, such as: sound, non-volatile memory, file system, transmit, receive, searcher, layer 1, layer 2, layer 3, main control, remote procedure, handset, power management, diagnostic, digital signal processor, vocoder, messaging, call manager, Bluetooth® system, Bluetooth® LPOS, position determination, position engine, user interface, sleep, data services, security, authentication, USIM/SIM (universal subscriber identity module/subscriber identity module), voice services, graphics, USB (universal serial bus), multimedia such as MPEG (Moving Picture Experts Group) protocol multimedia, GPRS (General Packet Radio Service), short message service (SMS), short voice service (SVS™), web browser, etc. For the disclosed aspects, processing subsystems 56 of processor 52 may include any subsystem components that interact with applications executing on computer platform 48.

Computer platform 48 may further include a communications module 58 that enables communications among the various components of communication device 14, as well as being operable to exchange content 24 (FIG. 1) and content requests between the communication device 14 and communications network 28 (FIG. 1). Communications module 58 may be embodied in hardware, firmware, software and/or combinations thereof, and may further include all protocols for use in intra-device and inter-device communications. Further, communications module 58 is operable to transmit and/or receive information, such as requesting multimedia content 16 (FIG. 1) and receiving the compressed media/signaling content 28 and bytecode 22' (FIG. 1), in accordance with the apparatus and methods described herein.

In some aspects, the memory 50 of the communication device 14 may further store a user interface module 60 operable to retrieve, store and play multimedia content 16 across the communications network 12 in a background or a foreground process. The user interface module 40 may comprise one or any combination of hardware, software, firmware, data and executable instructions operable to perform these functions, including a media player appropriate for the type of multimedia content 16 and capabilities of the user interface 42.

Figure 3:
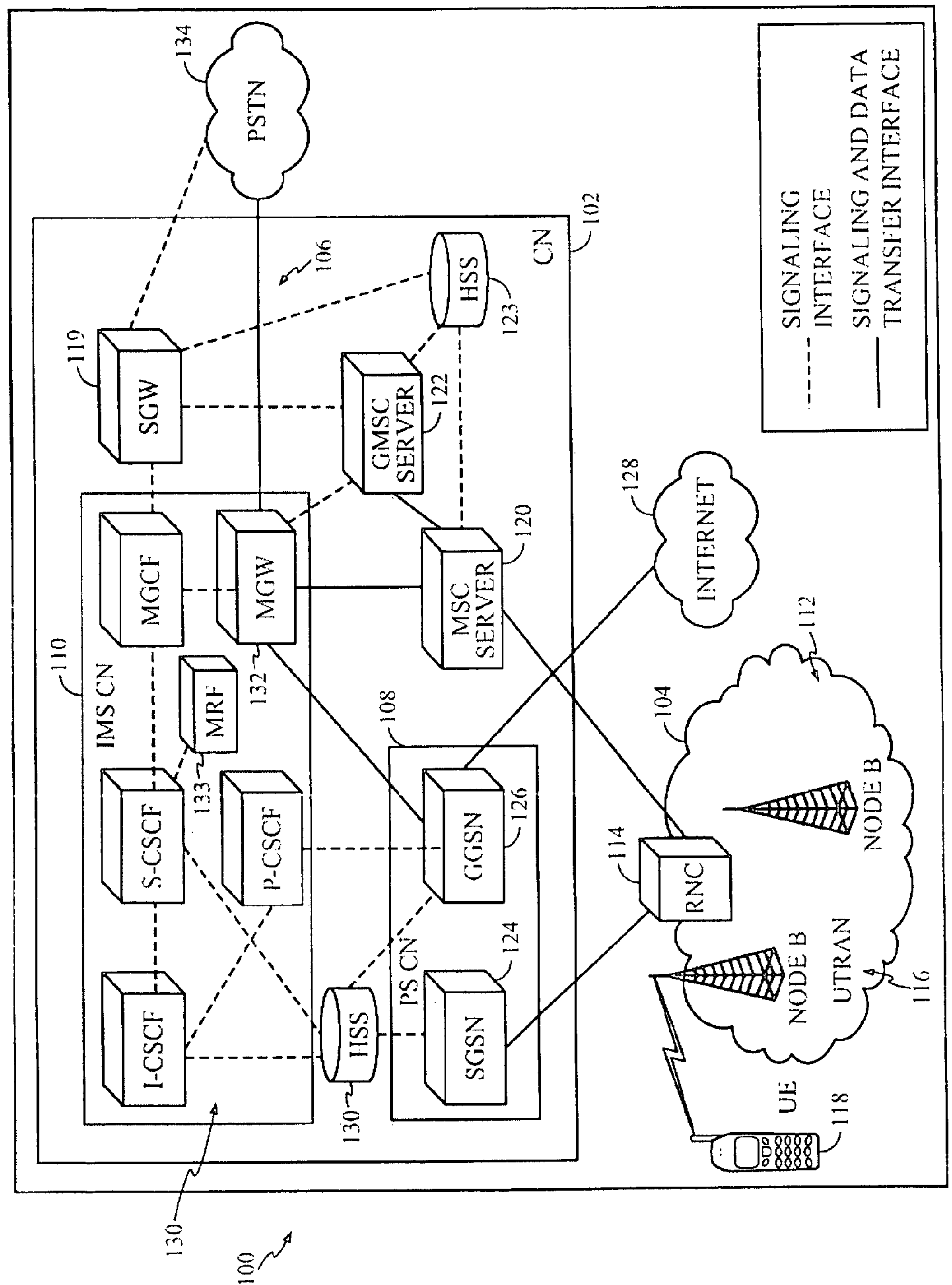
FIG. 3 is diagram of the wireless device and communication network of FIG. 1 depicting further features of a Third Generation Partnership Project (3GPP) release five (5) network architecture.

Referring to FIGS. 3-6, as the exemplary environment for use of the signal compression optimization system 10, a network architecture 100 is disclosed for performing a particular type of signal compression (SigComp) that is mandated by the Third Generation Partnership Project (3GPP) and 3GPP2 standards for the IP Multimedia Subsystem (IMS) networks and that is defined in RFC 3320, RFC 3321, and 3GPP standards for IMS (e.g., 3GPP TS 23.228). In FIG. 3, a universal method compresses the SIP signaling messages sent over the air between a mobile communication device (SIP User Agent) and Proxy Call/Session Control Function (P-CSCF). This involves the compressing party sending a decompression algorithm to the de-compressing party as part of the first message transmitted. The de-compressing party (communication device 14) on reception of the algorithm (bytecode 22'), executes a Universal Decompressor Virtual Machine (UDVM) interpreter 64 in memory 50 that interprets the bytecode 22' received and decompresses the following messages (compressed media/signaling content 28). An advantage of this approach is the ability to support any kind of algorithm as long as its bytecode 22 is supplied over the air. A call control module in memory 50 in the exemplary version is a local Session Initiation Protocol (SIP) and Session Description Protocol (SDP) application 66 that defines protocols for this communication.

A computational overhead resulting from executing the decompression bytecode in the UDVM interpreter induces a delay as each instruction in the bytecode is interpreted, which may impair user experience due to prolonging call setup times. A decompressor dispatcher module 68 in memory 50 advantageously mitigates this delay by one or more optimization implementations supported by the computer platform 48 of the communication device 14 by reducing usage of the UDVM interpreter 64.

As a first implementation, early compilation of the bytecode 22 into the machine code that could be executed by an optimized decompressor module 70 in memory 50 provides a very efficient execution of decompression algorithms and thus shortens the latency of following SIP messages processing and call setup times. To that end, the decompressor dispatcher module 68 accesses a decompression library 72 to compare the received bytecode 22' with one or more locally accessible bytecodes 22", each paired with a respective decompression machine code 36. Upon detection of a match, the decompression machine code 36 may be executed by the optimized decompressor module 70 rather than the UDVM interpreter 64.

As a second implementation, for a new received bytecode 22' for which the decompressor dispatcher module 68 fails to detect a match, the decompressor dispatcher module 68 directs a compiler 74 in memory 50 to generate the decompression machine code 36 that is then stored along with the bytecode 22' in an empty code storage record 76 and a vacant index 78, respectively in the decompression library 72. This compilation may occur in background so that future instances of this bytecode 22' may be handled by the first implementation.

As a third implementation, upon failing to detect a match as in the second implement, the decompressor dispatcher module 68 forwards a request for the bytecode 22' to be externally compiled or retrieved from a periodically updated database of decompression machine codes for future instances.

As a fourth implementation, the computer platform 58 may advantageously include a UDVM hardware processor (e.g., Digital Signal Processor (DSP)) 80 that facilitates faster setup by allowing parallel processing in a device hardware optimized for decompression. The decompressor dispatcher module 68 utilizes a proxy UDVM 82 to emulate the UDVM 64 for the benefit of the Local SIP/SDP application 66.

Figure 2:
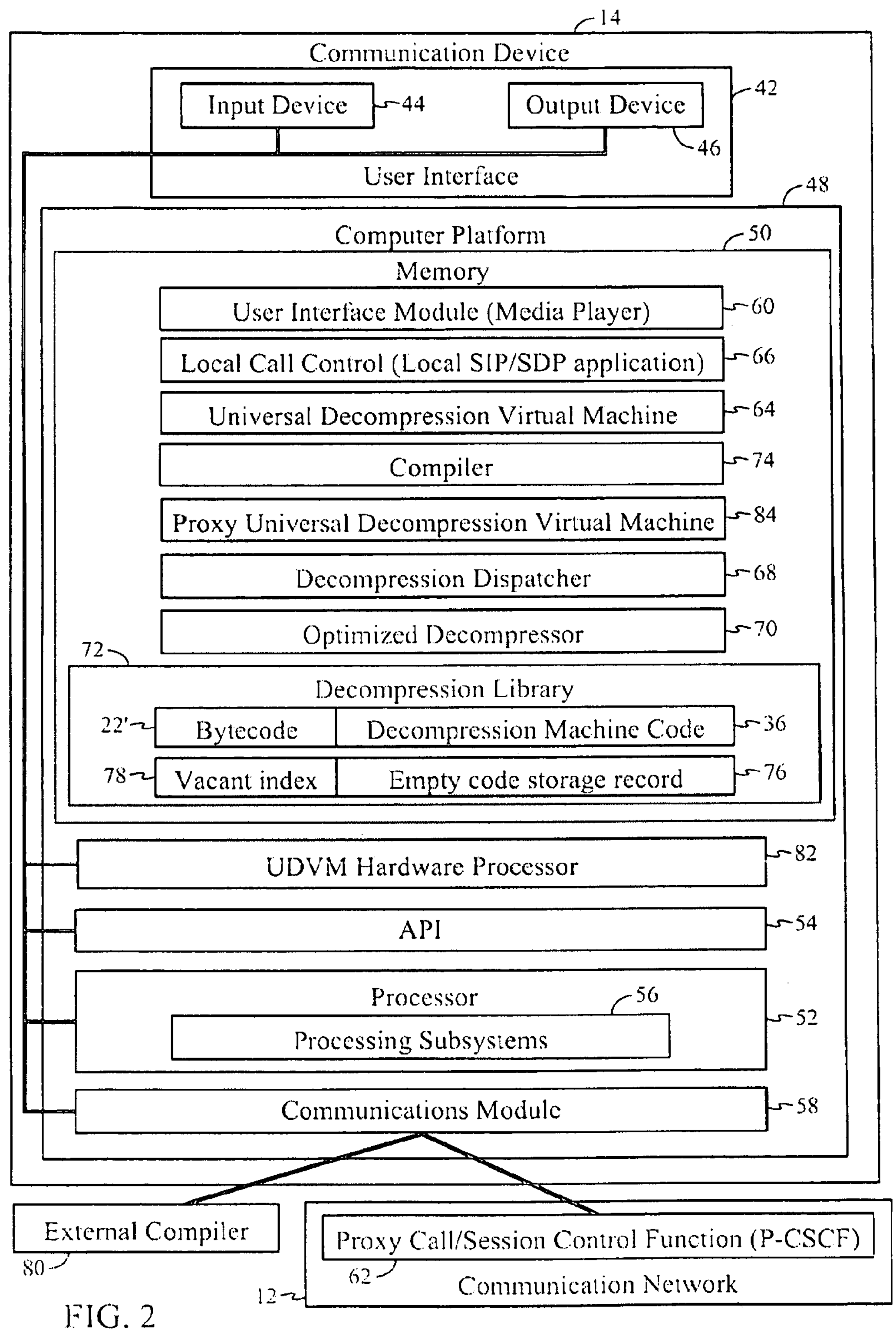
FIG. 2 is a schematic diagram of one aspect of components of the wireless devices of the system of FIG. 1.

In FIGS. 3-6, the communication network 100 generally consistent with the 3GPP release five (5) network architecture described in 3GPP TS 23.228, 3GPP TS 23.002 provides an operating environment for the signal compression optimization system 10 of FIGS. 1-2. With particular reference to FIG. 3, the communication network 100 is logically divided into a Core Network (CN) infrastructure 102 and an Access Network (AN) infrastructure 104. The CN infrastructure 102 is logically divided into a Circuit Switched (CS) domain 106, a Packet Switched (PS) domain 108 and Internet Protocol (IP) Multimedia Subsystem (IMS) 110. The AN infrastructure 104, depicted as the UMTS Terrestrial Radio Access Network (UTRAN) interfaces 104, is formed by a hierarchical Radio Network Subsystem (RNS) 112, whose elements are Radio Network Controller (RNC) 114, Node B elements 116 and User Equipment (UE) 118. The Node B 116 is a logical network component that serves one or more cells. It is the radio transmission/reception unit for communication in the radio cells. The RNC 114 is a network component with the functions for control of one or more Node B elements 116. The RNC 114 handles protocol exchanges between UTRAN interfaces 104. The RNC 114 provides centralized operation and maintenance of the radio network subsystem 112 including access to an operations support system (not shown). Among other things, the functions of the RNC 114 include radio resource control, admission control, channel allocation and handover control. The entities specific to the circuit switched domain 106 are signaling gateway (SGW) 119, Mobile Switching Centre (MSC) 120 and Gateway Mobile Switching Centre (GMSC) 122. The CS switched domain 106 may also include certain home subscriber services 123 constrained to this type of signaling. The MSC 120 constitutes the interface between the radio network subsystem 112 and the fixed networks. The GMSC 122 is an MSC 120 that performs routing to the actual location of a mobile station (user equipment (UE)) 118. The entities specific to the packet switched domain 108 are Serving GPRS Support Node (SGSN) 124 and Gateway GPRS Support Node (GGSN) 126. The SGSN 124 and GGSN 126 handle packet traffic. The SGSN 124 delivers packets to mobile stations 118 within its service area. The SGSN 124 performs mobility management functions such as handing off a roaming subscriber from the user equipment 118 in one cell to the equipment in another. The GGSNs 126 are used as interfaces to external IP networks such as the public Internet 128, other mobile service provider's GPRS services (home subscriber service (HSS)) 130, or enterprise intranets (not shown). The GGSNs 126 maintain routing information that is necessary to tunnel protocol data units (PDUs) to the SGSNs 124 that service particular mobile stations 122.

IP Multimedia Subsystem (IMS) entities of the IMS Core Network 110 were introduced as part of Third Generation Partnership Project (3GPP) release five (5) to create a common platform to develop diverse multimedia services in accordance with a mobile Internet paradigm. The IMS entities comprises all core network elements for the provision of IP multimedia (IM) services, for example Call Session Control Functions (CSCF) 130 (i.e., Interrogating, Proxy, and Serving), IMS Media Gateway Function (MGW) 131, Media Gateway Control Function (MGCF) 132, and Multimedia Resource Function 133. The IMS CN 110 per 3GPP standardizes functions rather than nodes as defined by standardized interfaces. Implementers are free to combine two functions into a single node or to split a single function into two or more nodes. The IMS CN 110 is a domain that controls voice and multimedia calls and sessions as well as the interconnection to other networks like a Public Switched Telephone Network (PSTN) 134 and other UMTS networks such as HSS 130. It has a signaling plane and a media plane that traverse different paths.

SigComp is a part of the IMS CN 110 and it is used to compress SIP signaling traffic. The IP Multimedia (IM) domain enables cost reductions and introduction of new services, e.g. voice telephony, video telephony, multimedia conferencing, instant messaging and real-time interactive games. IMS enables convergence of, and access to, voice, video, messaging, data and web-based technologies for the wireless user, and combine the growth of the Internet with the growth in mobile communications. IP Multimedia Core Network Subsystem (IMS) makes it possible for Public Land Mobile Network (PLMN) operators to offer their subscribers multimedia services based on and built upon Internet applications, services and protocols. It utilizes the packet switched domain to transport multimedia signaling and bearer traffic. The packet switched domain maintains the service while the terminal moves and hides the movement from the IMS. IMS is independent of the circuit switched domain. The IM domain enables users and applications to control sessions and calls between multiple parties. It controls and supports network resources to provide the functionality, security and quality required for the calls. The IM domain provides for registration of users so that they can access their own services from any UMTS network. One additional role of the IM is to generate Call Detail Records (CDRs), which contain information on call participants, time, duration and volume of data sent and received. CDRs are used for charging purposes.

Figure 4:
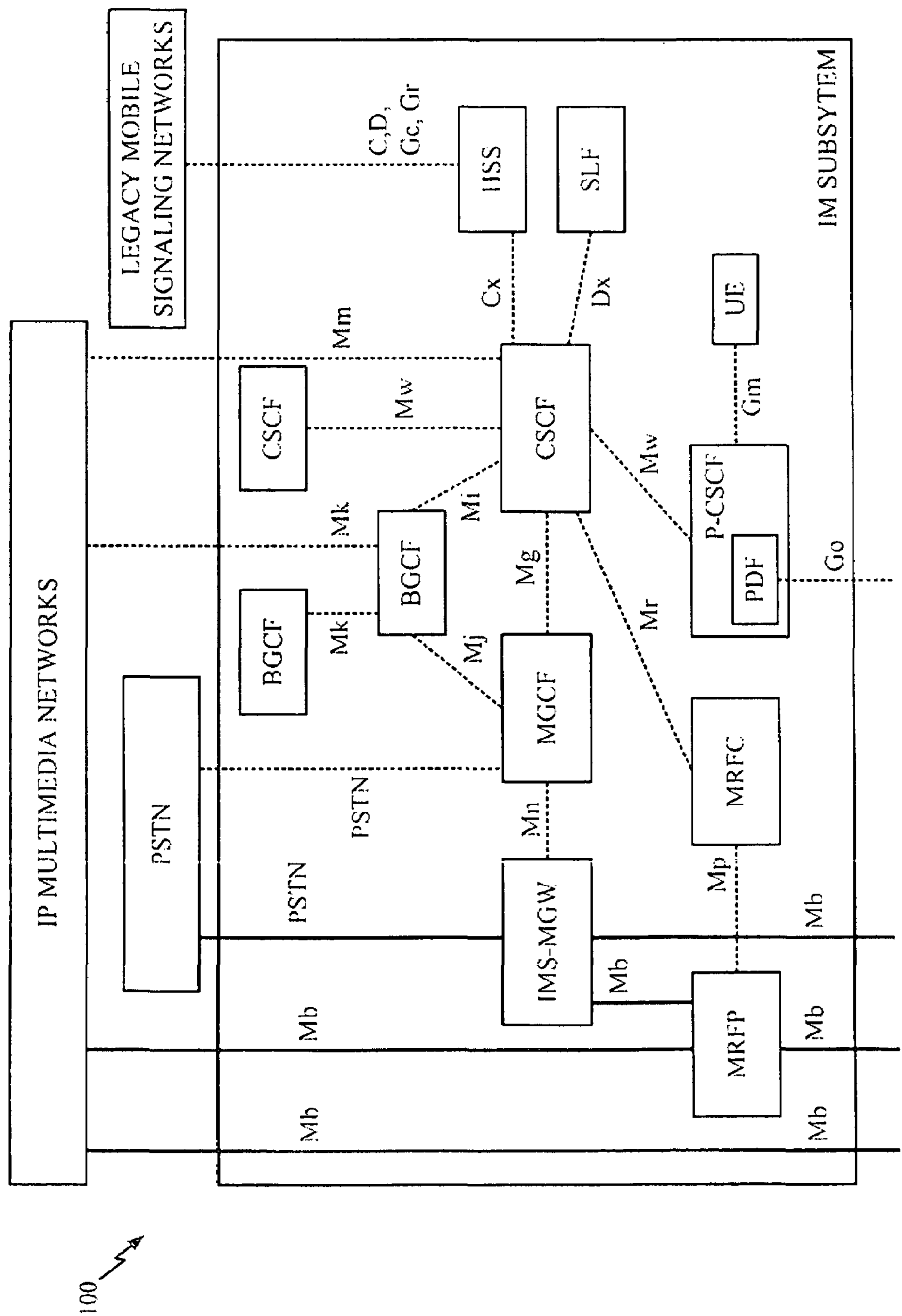
FIG. 4 is a configuration diagram of Internet Protocol (IP) Multimedia Subsystem (IMS) entities for the signal compression optimization system of FIG. 1.

In FIG. 4, the IMS entities per 3GPP TS 23.228 include CSCF, MGCF, IMS Media Gateway Function (IMS-MGW), Multimedia Resource Function Controller (MRFC), Multimedia Resource Function Processor (MRFP), Subscription Locator Function (SLF), Breakout Gateway Control Function (BGCF) and Application Server (AS), wherein interfaces supporting user traffic are shown as bold lines and interfaces supporting signaling are drawn as dashed lines.

The roles of IMS entities are described in 3GPP TS 23.228. The CSCF, which is a SIP server, can act as the Proxy CSCF (P-CSCF), Serving CSCF (S-CSCF) 138 or Interrogating CSCF (I-CSCF). The P-CSCF is the UE's first contact point for the IMS CN. The P-CSCF is also of special importance to SigComp, since it is the core network element that performs compression and decompression of SigComp messages. For this, the P-CSCF includes a compressor and a decompressor (IMS terminals include both as well). The S-CSCF handles the session states in the network while the role of the I-CSCF is to find the proper S-CSCF for a particular user. The MGCF performs protocol conversion, receives out of band information, communicates with the CSCF, selects the CSCF and controls parts of call state. The IMS-MGW terminates bearer channels from a switched circuit network and media streams from a packet network. It handles media conversion, bearer control and payload processing. The task of the MRFC is to control media stream resources in the MRFP, generate CDRs and interpret information coming from an AS and an S-CSCF and control MRFP accordingly. The MRFP provides resources that are controlled by the MRFC, controls bearers on the Mb reference point and mixes, sources and processes media streams. The SLF provides the name of the HSS containing the required subscriber specific data when requested by the I-CSCF during registration and session setup. It is also queried by the S-CSCF during the registration process. The BGCF selects the network in which PSTN breakout is to occur and chooses the MGCF that is used. The AS can be a SIP Application Server, an Open Service Access (OSA) Application Server or a Customized Application for Mobile Enhanced Logic (CAMEL) IP Multimedia Service Switching Function (IM-SSF). It offers value added IM services. The interface between the S-CSCF and the AS is used to provide services residing in the AS.

The IP multimedia subsystem attempts to be conformant to Internet Engineering Task Force (IETF) Internet standards in order to achieve access independence and to maintain a smooth operation with wireline terminals across the Internet per 3GPP TS 23.228. The signaling protocol that is used for registration and call control in the IM domain is the Session Initiation Protocol (SIP). SIP is the single protocol that is applied between UE and CSCF.

Figure 5:
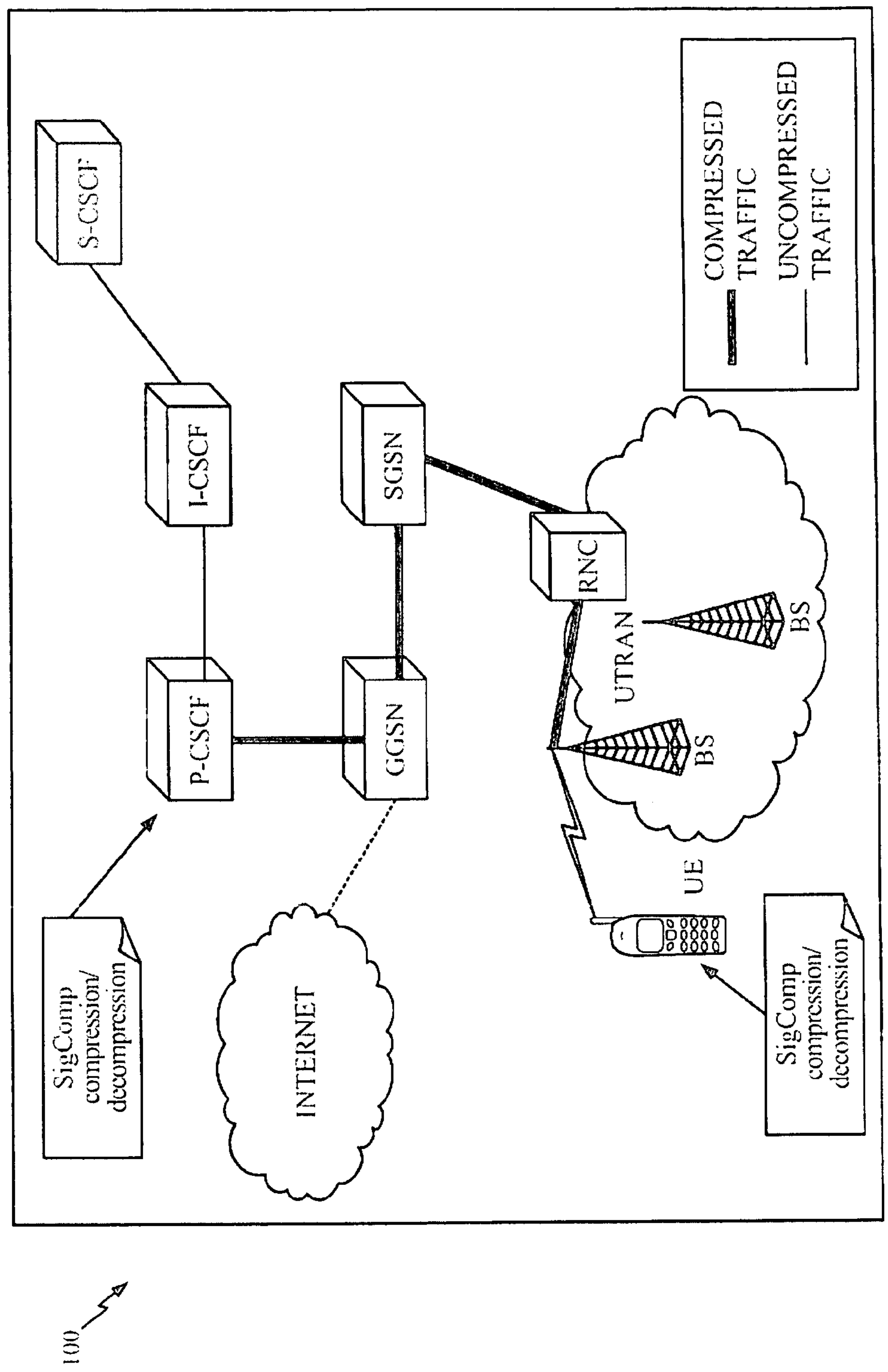
FIG. 5 is a block diagram of locations of Signal Compression (SigComp) endpoints.
Figure 6:
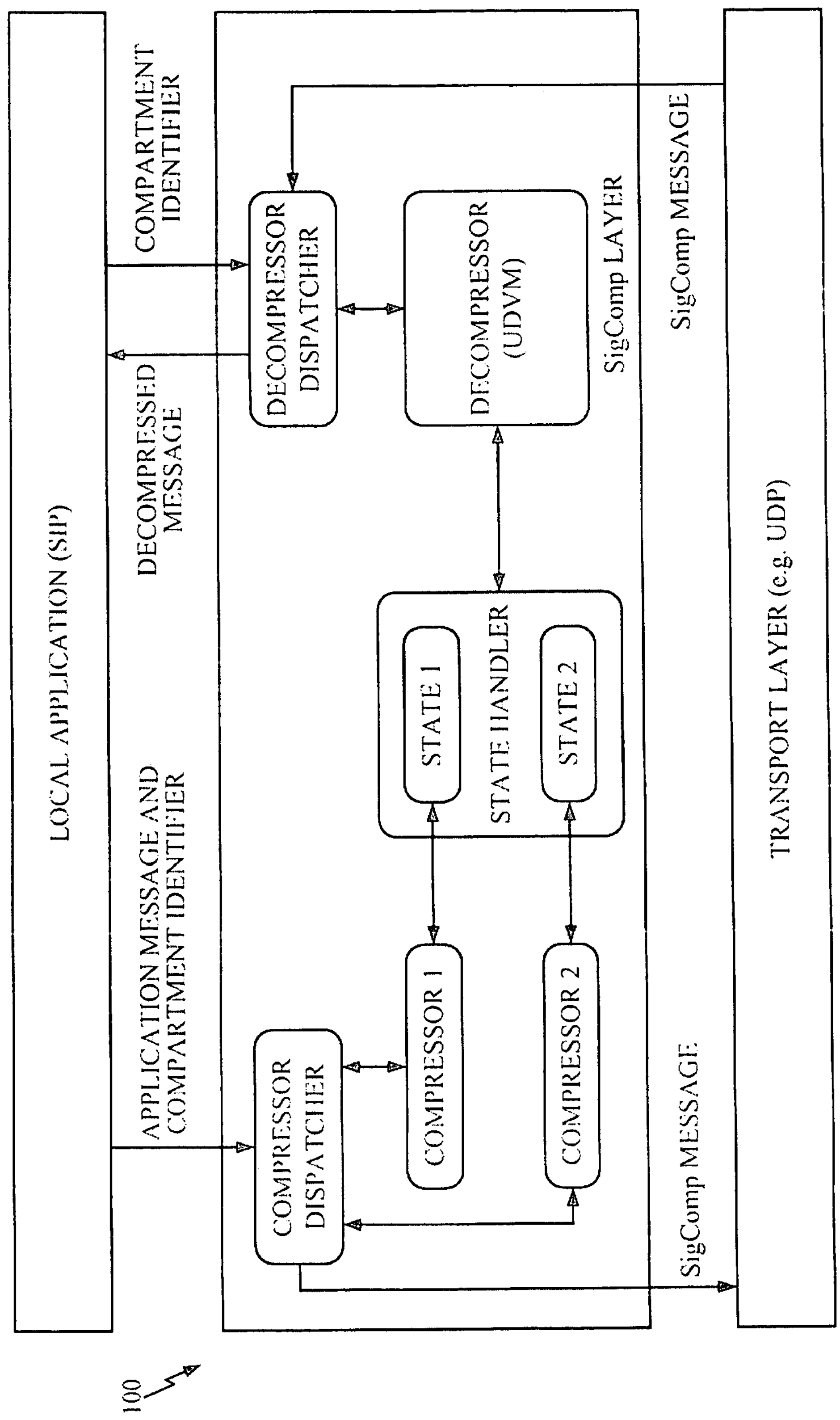
FIG. 6 is a block diagram of architecture of SigComp endpoints of FIG. 5.

In FIG. 5, the entity that compresses messages sent to a terminal and decompresses messages received from the terminal is the P-CSCF, which is depicted as a SIP signaling flow from a UE to the S-CSCF. SIP messages that are compressed with SigComp in the UE flow through the radio interface, Base Station (BS) and Radio Network Controller (RNC) of UMTS Terrestrial Radio Access Network (UTRAN). From the UTRAN they traverse through the Serving GPRS Support Node (SGSN) and Gateway GPRS Support Node (SGSN) all the way to the P-CSCF, where the SigComp messages are decompressed. From the P-CSCF onwards, the SIP messages are sent uncompressed. The reasons behind selecting the entity performing SigComp compression and decompression from the network core rather than from the radio access network are discussed below. First of all, the location of traffic encryption and decryption functionalities also affects the location of compression functionality, because compression has to be applied out bound from the points of encryption and decryption and it must be transparent. The packet content of some traffic types is authenticated, integrity protected or encrypted. The trusted party that decrypts traffic from and encrypts traffic to a terminal is in the mobile network core. If the endpoint was chosen from the radio access network, network design and performance would suffer from the complexity that would be added by transferring message keys within the mobile network. Another important issue that affects the location of signaling compression is handover. In SigComp, a relatively large amount of historical state is built up to enable efficient compression. If the endpoint performing decompression changed, this state would need to be transferred to the new entity to maintain compression efficiency. This kind of solution would add complexity to the network. When the decompression is performed in the P-CSCF, the decompressing endpoint remains stable for the duration of the application layer session.

Thus, the location of SigComp functions is in the mobile terminal and in the interior of the network, namely in the IMS. This approach contrasts with header compression, in which the compression functions are located in the terminal and in the radio access network. In the case of SigComp, messages are application level messages that do not contain routing information. They are carried in the payload of transport layer protocols, which in turn leave routing issues to IP. SigComp does not compress the headers of transport layer protocols. Only the entities interested in the content of the transport layer protocol payload, namely the two communicating endpoints, need to decompress SigComp messages.

It should be emphasized that the reason SIP signaling is sent compressed between the terminal and the P-CSCF is not to save a few bytes over the air interface. It is not worth saving a few bytes of signaling when the terminal will be establishing a multimedia session that will use much more bandwidth. The main motivation for compression is to reduce the time required to transmit SIP messages over the air interface.

In the IMS, the protocol that performs session control is the Session Initiation Protocol (SIP). SIP was originally used to invite users to existing multimedia conferences, but today it is mainly used to create, modify and terminate multimedia sessions. Although SigComp can be used to compress the messages of any text-based protocol, the main focus is currently on the compression of SIP messages.

SIP is independent of the type of multimedia session handled and of the mechanism used to describe the session. The most common format to describe multimedia sessions is the Session Description Protocol (SDP). SDP is simply a textual format that is carried in the body of SIP messages. This is the reason SigComp has to be able to efficiently compress both SIP and SDP. The SIP/SDP static dictionary was defined for this purpose.

SIP protocol defines several entities, which are user agents (UAs), redirect servers, proxy servers, registrars and location servers. All 3G terminals supporting 3GPP Release 5 or later releases contain a SIP UA. Also, 3GPP2 has adopted SIP. SIP makes use of proxy servers to help route requests to the user's current location, authenticate and authorize users for services, implement provider call-routing policies, and provide features to users. Redirect servers help in the location of SIP UAs by providing alternative locations where the user can be reachable. A registrar accepts registrations. It is usually co-located with a redirect server or a proxy server. A location server is not a SIP entity, but is an important part of any architecture that uses SIP. Location servers store and return possible locations of users.

SIP is a request/response protocol like the Hypertext Transfer Protocol (HTTP), on which it is based. SIP User Agent Clients (UACs) send requests and User Agent Servers (UASs) return responses. The start line of a request declares a method name, which indicates the purpose of the request.

The layout of a SigComp endpoint is illustrated in FIG. 5. It includes the following entities: compressor dispatcher, one or more compressors, state handler, Universal Decompressor Virtual Machine (UDVM) and decompressor dispatcher.

The task of the compressor dispatcher is to receive messages from the application and pass the compressed version of each message to the transport layer. The application has to provide the compressor dispatcher a compartment identifier together with each message. A compartment is an application specific grouping of messages that relate to a peer endpoint. In case of SIP, a compartment is formed by all messages belonging to a SIP dialog. The compartment identifier uniquely identifies a compartment. SigComp invokes compressors on a per-compartment basis, which means that a compartment identifier can also be used to identify a compressor. For this, a mapping between compartment identifiers and compressors has to be maintained. By providing a compartment identifier together with the application message, the application ensures that the compressor dispatcher can locate an appropriate compressor. Each time a new compartment identifier is encountered, a new compressor is invoked. Once the compressor has compressed the application message, a SigComp header is created and attached to it. After this, the compressor dispatcher can pass the SigComp message to the transport layer. When the application wishes to close a compartment, e.g. after receiving a BYE message and sending the final response, it should indicate this to the compressor dispatcher.

The compressor implements a certain compression algorithm that is used to compress application messages. One of the fundamental ideas of SigComp is that the standard does not dictate the use of one compression algorithm that should be used by all endpoints. Instead, the choice of the algorithm is left as an implementation decision. What follows is that each endpoint should be able to decompress the output of a variety of compression algorithms. This is made possible by the use of a virtual machine to take care of the decompression functionality. When a compressor creates a SigComp message containing a compressed application message, it includes a decompression algorithm to the header of the message. This decompression algorithm is called the bytecode, and it has been compiled to a form that can be executed on the virtual machine.

A number of requirements are placed on the compressor. First of all, it needs to be transparent (e.g., the compressor does not send bytecode that causes the UDVM to incorrectly decompress a SigComp message). The compressor should supply some form of integrity check over the application message to ensure that successful decompression has occurred. It must ensure that the message can be decompressed using the resources available at the remote endpoint. If the transport is message-based, as it is in the case of User Datagram Protocol (UDP), the compressor must map each application message to exactly one SigComp message. In case the transport is stream-based, but the application defines its own internal message boundaries, the compressor should also map each application message to exactly one SigComp message.

The role of the decompressor dispatcher is to receive SigComp messages from the transport layer, invoke a new instance of the UDVM to decompress each message, and pass the resulting uncompressed message to the application. Once the application has received the message, it maps the message to a compartment and returns the compartment's identifier to the decompressor dispatcher. The decompressor dispatcher then hands the identifier to the state handler, which uses the identifier to save state information and forward feedback information to an appropriate compressor. By supplying a compartment identifier, the application grants the dispatcher a permission to do this.

The Universal Decompressor Virtual Machine (UDVM) is the entity that decompresses SigComp messages. The decompression process is carried out by executing a special compiled program called the bytecode on the virtual machine. The UDVM is a virtual machine much like the Java Virtual Machine, but with the difference that it has been optimized for running decompression algorithms. In the case of SigComp, the source code that is compiled to bytecode is called the UDVM assembly and the entity compiling it is called the UDVM interpreter. The bytecode can be thought of as the machine language of the UDVM.

The UDVM provides flexibility when choosing how to compress a given application message: the compressor implementer has the freedom to select an algorithm of his choice. The compressed data is combined with a bytecode containing a set of UDVM instructions. These instructions are carried in the header of the SigComp message and they allow the original data to be extracted at the receiving endpoint.

Because SigComp can run over an unsecured transport layer, a separate instance of the UDVM is invoked on a per-message basis to ensure that damaged messages do not affect the decompression of later messages. However, during the decompression process the UDVM may invoke the state handler to access an existing state. This way the state of the UDVM instance that decompressed the previous message can be restored by a later UDVM instance.

When the UDVM has been initialized, the UDVM can receive additional compressed data from the decompressor dispatcher or state information from the state handler only upon request. As the decompression proceeds, the UDVM outputs decompressed data to the decompress or dispatcher. When it encounters the end of a message, it indicates this to the dispatcher, which provides it with a compartment identifier. This identifier is passed to the state handler in a state creation request. The state handler uses the compartment identifier to store the state information in a location in the state memory that is reserved for the corresponding compartment. The UDVM also forwards the feedback information that may be piggybacked to a SigComp message to the state handler.

A UDVM cycle is a measure of the amount of CPU power that is required to execute a UDVM instruction. A UDVM cycle limit is used to restrict the number of UDVM cycles that can be used to decompress each bit in a SigComp message. The amount of cycles a bytecode uses must be monitored because malicious users can send bytecodes containing looping code. However, the cycle limit only reduces the amount of damage that can be caused, but does not remove the problem.

In SigComp, the size of the decompressor memory is negotiable. The decompressing side advertises the size of the decompressor memory to the compressing side. The default size is two kilobytes. To improve the efficiency of the compression, a memory size of four or eight kilobytes or even more can be used. The decompressor memory is divided into two sections, the first of which is used to store the decompressed message. The other section is used for the UDVM to hold the bytecode and a circular buffer, which enables the use of states that are larger than the UDVM memory. This is possible because as soon as the buffer fills, the UDVM can start to overwrite content at the beginning of the buffer.

Because a separate instance of the UDVM is invoked to decompress each message that arrives, a way is needed to retain information between messages. This is the task of the SigComp state handler, which stores information between received SigComp messages. Thanks to the state handler, the compression ratio is improved since messages can be compressed relative to the information contained in previous messages. The state handler makes it possible to create state items for access when a later message is being decompressed. The state items typically contain either a snapshot of a UDVM instance's memory or an uncompressed message.

The state handler manages state memory on a per-compartment basis. As well as storing the state items themselves, it maintains a list of the state items created by a particular compartment and ensures that no compartment exceeds its allocated memory.

UDVM Interpreter is the entity that translates the UDVM instructions and their operands listed in UDVM assembly to the bytecode form. The UDVM interpreter takes as an input a file containing UDVM assembly source code and compiles it to a bytecode, which can be executed on the virtual machine.

Figure 7:
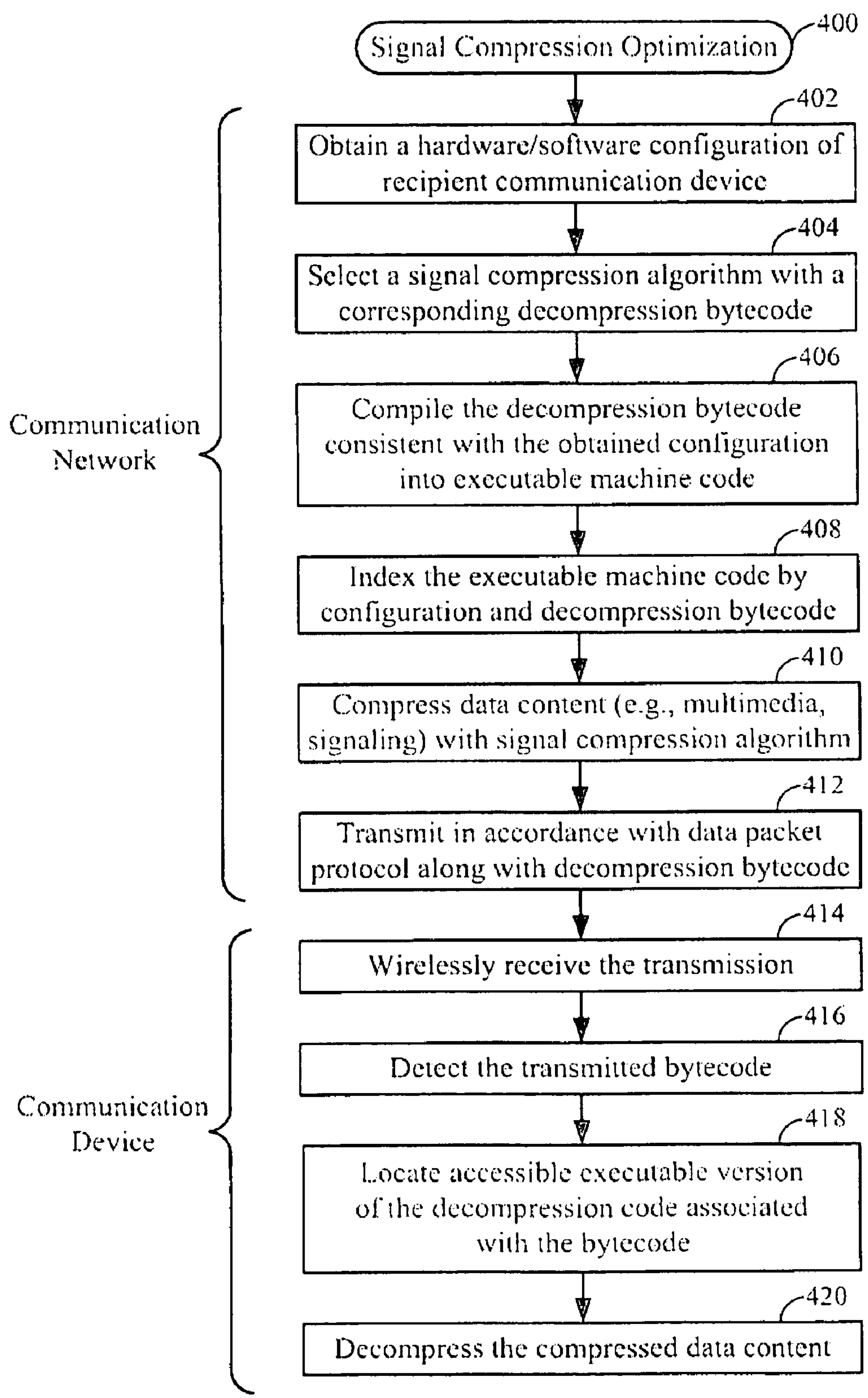
FIG. 7 is a flow diagram of a method of signal compression optimization implemented by the system of FIG. 1.
Figure 8:
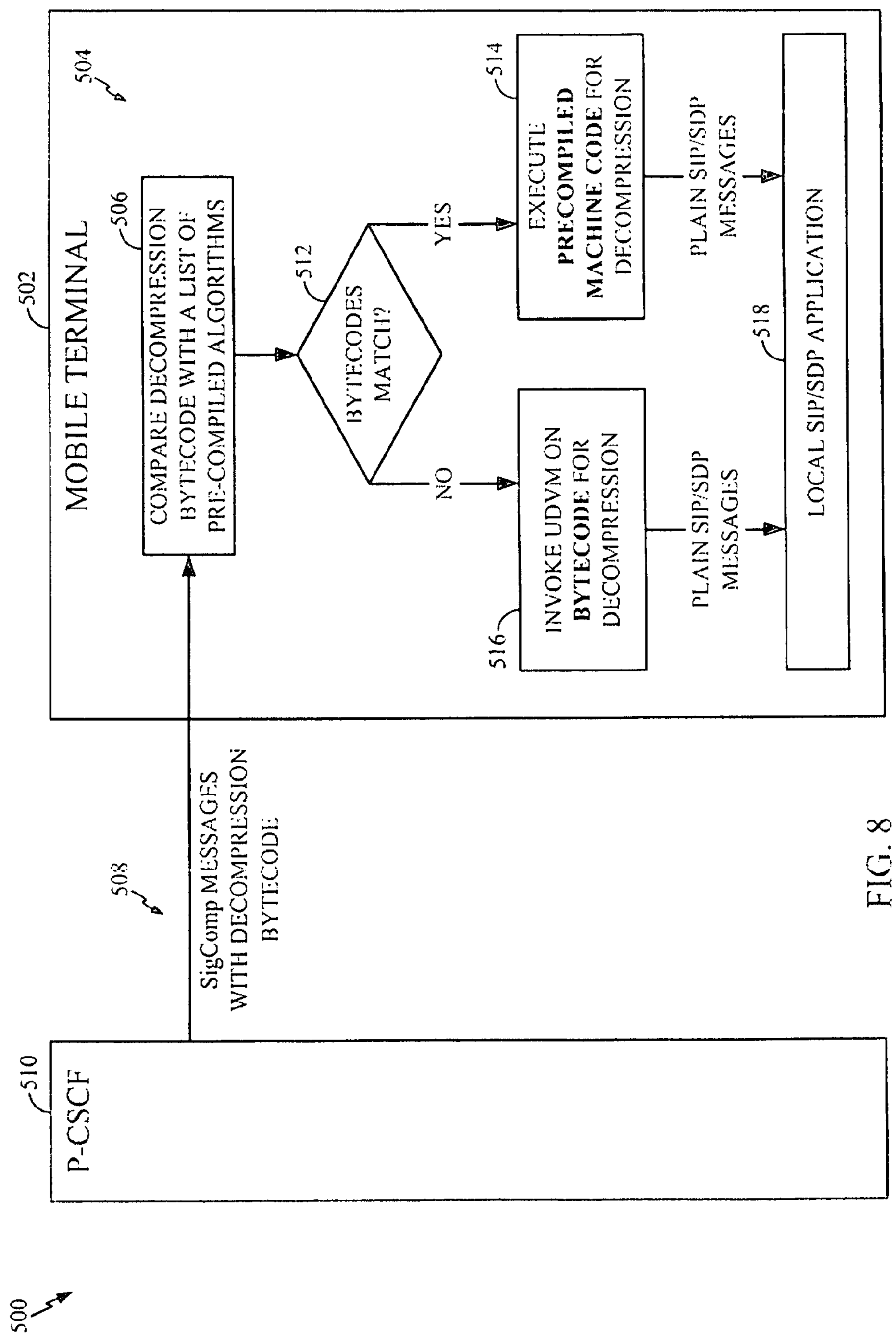
FIG. 8 is diagram depicting a version of signal compression optimization sequence of operations for the wireless device of FIG. 1.

With the operating environment of the signal compression optimization system 10 described, a signal compression optimization method 400 is depicted in FIG. 7. For clarity, the method is segregated sequentially into a communication network (disseminating) portion of blocks 402-412 followed by a communication device (recipient) portion of blocks 414-420. It should be appreciated that the method may include a plurality of entities and that dissemination of compressed SIP/SDP data content may be also be sent from a communication device to the communication network. Furthermore, the communication network or the communication device may represent a plurality of entities with dissemination be originating, relayed, or terminating in various combinations of such entities.

Beginning in block 402, the communication network may advantageously advance aspects of signal compression optimization system 10 by obtaining hardware/software configuration of a recipient communication device. This could entail a comprehensive database meant to remain up to date on the universe of possible communication devices, or particularly focused on those that support other aspects of the signal compression optimization system 10 disclosed herein. This data may be supplied by Original Equipment Manufacturers (OEM) or be interactively obtained via SIP/SDP communication with individual communication devices or hierarchical entities that support a population of such communication devices. In block 404, a signal compression algorithm is selected, along with a corresponding decompression source code (bytecode). Such a selection may be made advantageously with awareness of whether the recipient communication device(s) have local access to an executable version of the bytecode rather than expecting the communication device to invoke a UDVM. In block 406, the communication network compiles the bytecode consistent with the obtained hardware/software configuration to produce executable machine code. Such compilation may wait for a request and then be transmitted immediately. In the depicted sequence, in block 408, this compilation is done in advance of a request and indexed according to the bytecode and configuration for dissemination upon request.

Data content (e.g., multimedia content and/or signaling) is compressed according to a compression algorithm in block 410. The compressed data content is then transmitted in accordance with a data packet protocol along with the selected source code ("bytecode") that is suitable for interpretation at the communication device (mobile terminal) to decompress the data content (e.g., multimedia, signaling, etc.). In the exemplary implementation, in block 412 the communication network wirelessly transmits the compressed data content in accordance with a data packet protocol along with the selected source code (bytecode).

In blocks 414, the communication device wirelessly receives the transmission. In block 416, the transmitted bytecode is detected. In block 418, an accessible executable version of the decompression code associated with the detected bytecode is located, avoiding the slower interpretation of the bytecode on a virtual machine. Accessing the executable version may entail local or remote compilation in advance of execution with storage for future use. The executable version may entail utilizing digital signal processing or other types of hardware optimized decompressor in order to avoid use of a UDVM interpreter. In block 420, the compressed data content is then decompressed using the accessible executable version.

In FIGS. 8-11, four particular implementations of the method of FIG. 7 are depicted. First, in FIG. 8, a signal compression optimization apparatus 500 builds upon an assumption that a set of compression algorithms to be used is known in advance and is incorporated into a mobile terminal 502 by provisioning with a machine code implementation for these decompression algorithms. The Signaling Compression (SigComp) optimization operation 504 performed on the mobile terminal 502 can compare in block 506 the decompression bytecode detected along with SigComp messages sent over a communication channel 508 by a Proxy Call/Session Control Function (P-CSCF) 510. If in block 512, the SigComp optimization operation 504 determines that an exact match is detected, then in block 514 machine code decompression is executed. If however in block 512 an exact match was not determined, then in block 516 the Universal Decompressor Virtual Machine (UDVM) interpreter is invoked on the bytecode for decompression. The local SIP/SDP application 518 receives plain SIP/SDP messages that were initially compressed by the P-CSCF. Thus, if an algorithm is sent by the P-CSCF 510 (for example during roaming or after network upgrade) that is not recognized in block 512, the mobile terminal 502 will still be able to execute the standard UDVM interpreter.

Figure 9:
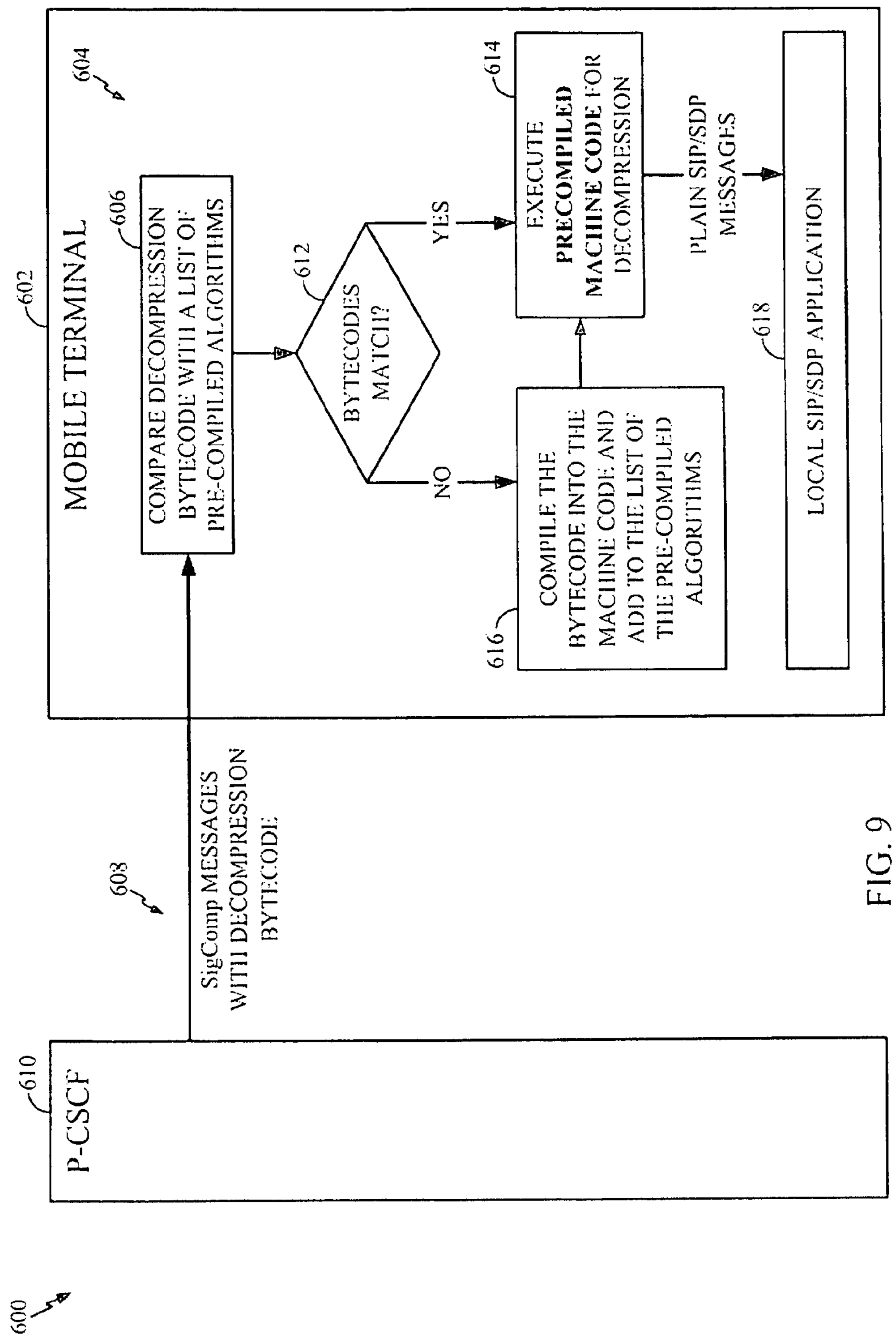
FIG. 9 is a diagram depicting a version of signal compression optimization sequence of operations for the wireless device of FIG. 1.

In FIG. 9, an alternative signal compression optimization apparatus 600 entails "just-in-time" compilation by a SigComp optimization operation 604 that compares in block 606 decompression bytecode received over a communication channel 608 from a P-CSCF 610 with a list of pre-compiled algorithms. If the bytecode is found to be a match in block 612, then the associated machine code of the pre-compiled algorithm is used in block 614 for decompression. If no match was found in block 612, then the bytecode is compiled in block 616 into machine code and then block 614 is performed, in either event providing plain SIP/SDP messages to a Local SIP/SDP application 618. Thus, this bytecode is compiled once and is used for decompression of all the following Session Initiation Protocol (SIP) messages. In FIG. 9, use of the UDVM is avoided by waiting until the compilation is performed. This method requires bytecode compilation capability on the target. All the messages after the first one do not suffer from any processing inefficiency that would have been induced by executing UDVM interpreter code. Alternatively, compilation may occur in background for future use while invoking the UDVM interpreter for the current communication.

Figure 10:
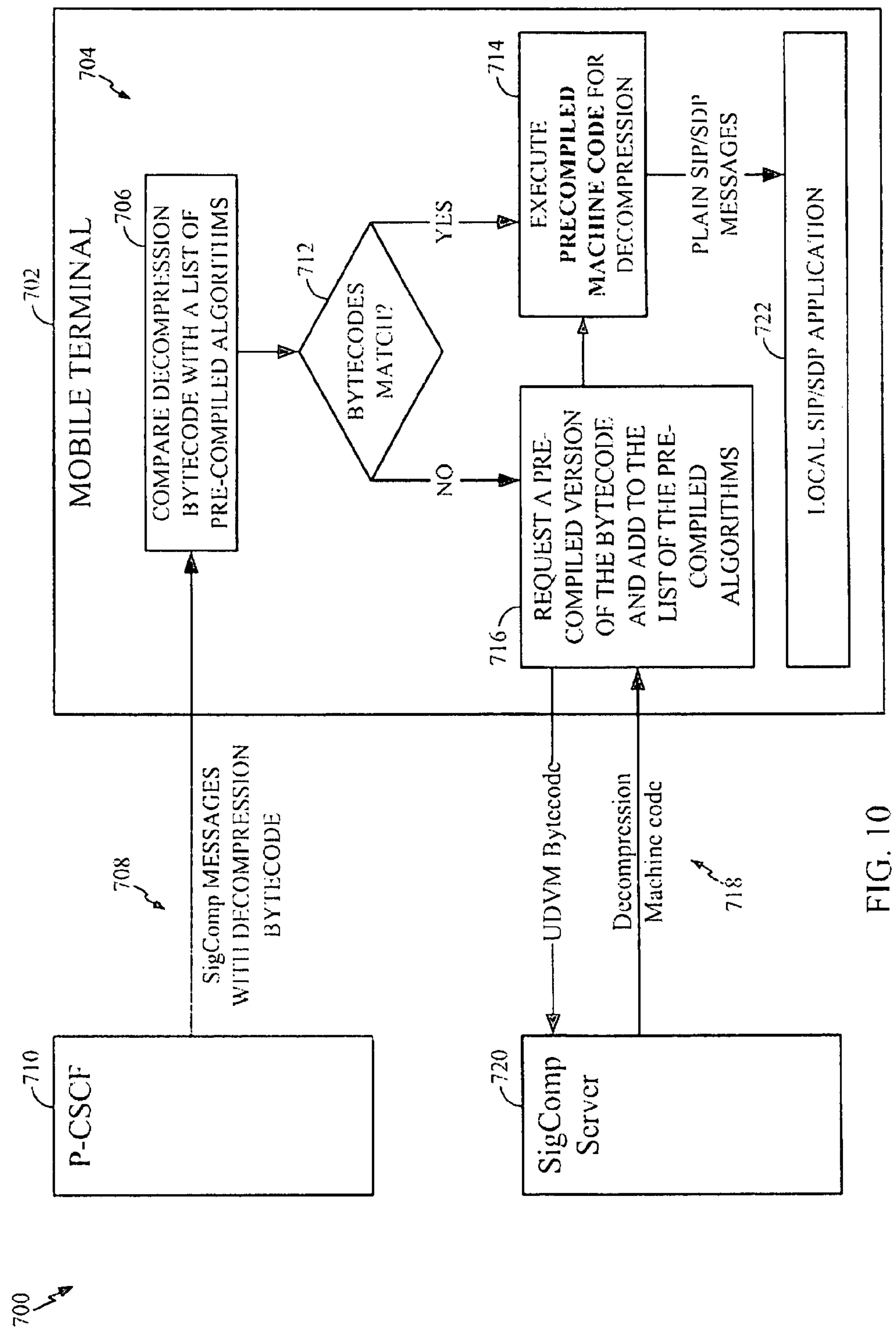
FIG. 10 is a diagram depicting a version of signal compression optimization system of FIG. 1.

In FIG. 10, another alternative signal compression optimization apparatus 700 extends the use of a compiled version of the bytecode, but instead of compiling the bytecode on target, the machine (e.g. compiled) code is sent by the network. To make sure that this machine code is compatible to the mobile in question, a network (SigComp server 720) can first check the Hardware/Software version number of a mobile terminal 702 using SIP messaging capabilities via a channel 708. In other words, the network chooses the appropriate machine code that needs to be sent to the mobile station, according to mobile station's hardware/software (HW/SW) information. The machine code received can be stored on the mobile station's permanent memory to avoid subsequent re-transmission of the same machine code. To that end, a SigComp optimization operation 704 in block 706 compares the decompression bytecode received over the communication channel 708 form a P-CSCF 710. If a bytecode match is determined in block 712, then the precompiled machine code is executed in block 714. If no match was found in block 712, then a pre-compiled version of the bytecode is requested from the SigComp Server 720 and the bytecode is added to the list (block 716). The machine code is then available for execution to achieve decompression in block 714 to provide plain SIP/SDP messages to a local SIP/SDP application 722.

Figure 11:
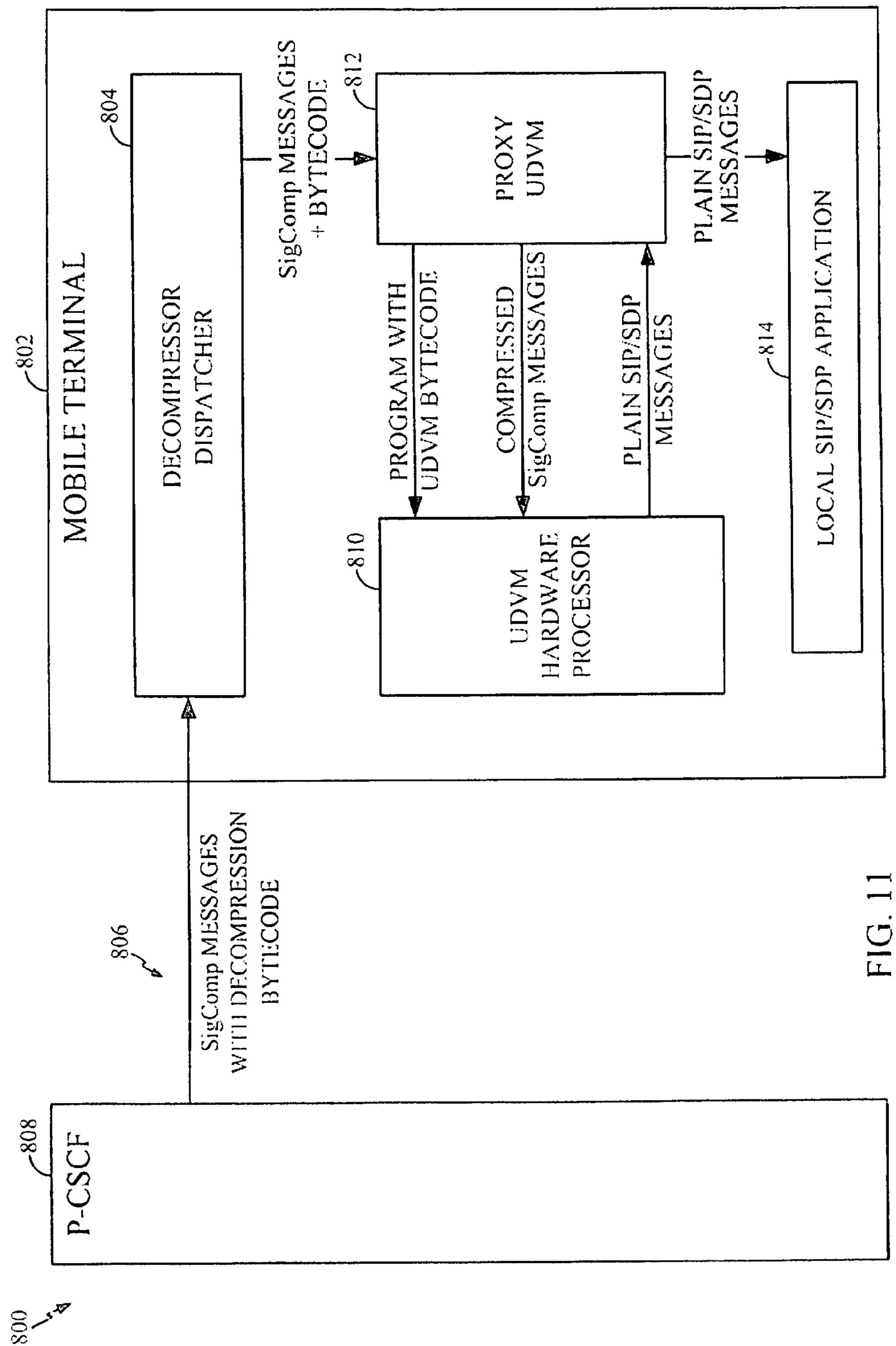
FIG. 11 is a diagram depicting a version of signal compression optimization system of FIG. 1.

In FIG. 11, yet an additional alternative signal compression optimization apparatus 800 has mobile terminal 802 whose decompressor dispatcher 804 receives SigComp messages with decompression bytecode via a communication channel 806 from a P-CSCF 808. The mobile terminal 802 utilizes an optimized hardware processor 810. Proxy UDVM 812 programs the hardware processor 810 with specific bytecode and then sends SigComp messages for decompression in the hardware processor 810. The hardware processor can be either a dedicated accelerator or a general-purpose DSP programmed for UDVM interpretation. The plain SIP/SDP messages are then utilized by a local SIP/SDP application 812.

This system and method can also be applied to the Network side to reduce processing requirement of P-CSCF servers.

Implementation. A variety of implementations are possible. It is likely that some advanced implementation, such as a method in which the network sends a pre-compiled decompression binary to the mobile station, would require some support from infrastructure vendors and therefore would require some form of standardization. Therefore, in some implementations, it may be appropriate to include at least some of the features of the method and apparatus disclosed herein in standards such as those promoted by 3GPP/3GPP2 or IETF (Internet Engineering Task Force) standards organizations.

Experimental results. After running some bench-marking of UDVM performance, the following was observed: (1) The UDVM interpreter decompresses SIP messages about 20 times slower compared to a native decompression algorithm. (2) The time that it takes for UDVM to decompress a SIP message during a normal call setup on a QUALCOMM MSM6800 chipset is about 100 ms on a mostly idle central processing unit (CPU). This time goes up with advanced call setup scenarios, such as usage of PRACK (i.e., a SIP method that acknowledges the reception of a provisional response) or Quality of Service (QoS) preconditions. (3) Introduction of better compression algorithms that improve compression efficiency would increase UDVM decompression time significantly. To summarize, this invention can potentially reduce the call setup time by at least 100 ms or even more in case of CPU load or complicated SIP call setup flows.

FIGS. 12-13 depict performance results for simple UDVM algorithms on SURF 6800 Subscriber Unit Reference Design Boards. Particularly, FIGS. 12-13 are charts of Static DEFLATE and Lempel-Ziv-Storer-Szymanski (LZSS) decompression algorithms, respectively. The LZSS and DEFLATE algorithms are standard, known compression systems. DEFLATE is a lossless data compression algorithm that uses a combination of the Lempel-Ziv 1977 (LZ77) algorithm and Huffman coding and was originally defined by Phil Katz for version 2 of his PKZIP archiving tool, and was later specified in RFC 1951 Although LZSS compression was one of the algorithms used for bench marking, the invention does not require any specific compression algorithm. An exemplary candidate is Dynamic DEFLATE. However, the complexity of the DEFLATE algorithm is greater than that of the LZSS, meaning that the performance reduction will likely be greater in the DEFLATE implementation.

The various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Further, the steps of a method or algorithm described in connection with the aspects disclosed herein may be embodied directly in hardware, in a software module executed by a processor, or in a combination of the two. For example, the steps of a method may be embodied in one or more modules of a processor operable to execute the respective method steps. A software module may reside in RAM memory, flash memory, ROM memory, EPROM memory, EEPROM memory, registers, a hard disk, a removable disk, a CD-ROM, or any other form of storage medium known in the art. An exemplary storage medium is coupled to the processor, such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal. Further, for example, the steps of a method or algorithm may be embodied in a computer program product comprising a computer readable medium having one or more sets of instructions operable to cause a computer to execute the respective method steps.

Referring back to FIG. 1, the communications network 12 may comprise any data and/or voice communications network. For example, communications network 28 may comprise all or some portion of any one or any combination of: a wired or wireless telephone network; a terrestrial telephone network; a satellite telephone network; an infrared network such as an Infrared Data Association (IrDA)-based network; a short-range wireless network; a Bluetooth® technology network; a ZigBee® protocol network; an ultra wide band (UWB) protocol network; a home radio frequency (HomeRF) network; a shared wireless access protocol (SWAP) network; a wideband network, such as a wireless Ethernet compatibility alliance (WECA) network, a wireless fidelity alliance (Wi-Fi Alliance) network, and a 802.xx network; a packet data network; a data network; an Internet Protocol (IP) Multimedia Subsystem (IMS) network; a public switched telephone network; a public heterogeneous communications network, such as the Internet; a private communications network; a multicast network such as a Forward Link Only (FLO) network, including the MediaFLO™ System available from Qualcomm, Inc. of San Diego, Calif.; a digital video broadcasting (DVB) network, such as DVB-S for satellite, DVB-C for cable, DVB-T for terrestrial television, DVB-H for terrestrial television for handhelds; and a land mobile radio network.

Further, examples of telephone networks that may be included in some aspects of communications network 28 include at least a portion of one, or any combination, of analog and digital networks/technologies, such as: code division multiple access (CDMA), wideband code division multiple access (WCDMA), universal mobile telecommunications system (UMTS), advanced mobile phone service (AMPS), time division multiple access (TDMA), frequency division multiple access (FDMA), orthogonal frequency division multiple access (OFDMA), global system for mobile communications (GSM), single carrier (1X) radio transmission technology (RTT), evolution data only (EV-DO) technology, general packet radio service (GPRS), enhanced data GSM environment (EDGE), high speed packet access (HSPA), analog and digital satellite systems, and any other technologies/protocols that may be used in at least one of a wireless communications network and a data communications network.

While the various disclosed aspects have been illustrated and described, it will be clear that the subject matter of this document is not limited to these aspects only.

For example, for conciseness, the communication device 14 is depicted receiving (decompressing) multimedia content 16. Applications consistent with the aspects of the present invention may entail reverse or two-way transmission of such multimedia content. For example, multimedia content generated by a still image or video camera or otherwise stored on the communication device 14 may be uploaded to the communication network 12. Moreover, the communication network 12 may be responsive to detecting the bytecode provided by the communication device 14 to henceforth utilize the same bytecode and corresponding compression algorithm for transmitting multimedia content 16 to the communication device 14. Thereby, the communication device 14 may increase the likelihood of receiving multimedia content 16 for which an optimized decompression technique is supported without resorting to the UDVM interpreter 62.

Therefore, while the foregoing disclosure shows illustrative aspects, it should be noted that various changes and modifications could be made herein without departing from the scope of the described aspects as defined by the appended claims. Furthermore, although elements of the described aspects may be described or claimed in the singular, the plural is contemplated unless limitation to the singular is explicitly stated.

In addition, while a particular feature may have been disclosed with respect to only one of several implementations, such feature may be combined with one or more other features of the other implementations as may be desired and advantageous for any given or particular application. To the extent that the terms "includes," and "including" and variants thereof are used in either the detailed description or the claims, these terms are intended to be inclusive in a manner similar to the term "comprising." Furthermore, the term "or" as used in either the detailed description of the claims is meant to be a "non-exclusive or".

Furthermore, although elements of the described aspects and/or versions may be described or claimed in the singular, the plural is contemplated unless limitation to the singular is explicitly stated. Additionally, all or a portion of any aspect and/or version may be utilized with all or a portion of any other aspect and/or version, unless stated otherwise.

What is claimed is:

1. A method of communicating data content comprising:

detecting a source code in at least one message transferred via a data packet protocol, wherein the at least one message comprises compressed data content, wherein the compressed data content comprises data content compressed by a selected one of a plurality of compression algorithms;

requesting an executable version of the detected source code from a remote entity;

receiving the executable version of the detected code from a remote entity;

locating an accessible executable version of a corresponding decompression algorithm associated with the detected source code, wherein the corresponding decompression algorithm is capable of reproducing the data content from the compressed data content; and decompressing the compressed data content utilizing the located accessible executable version of the corresponding decompression algorithm.

2. The method of claim 1, further comprising invoking a virtual machine to interpret the corresponding source code to decompress the compressed data content in response to failing to locate an accessible version of the corresponding decompression algorithm associated with the detected source code.

3. The method of claim 1, further comprising ascertaining a configuration of an intended processor that the executable version is destined for and compiling the source code for the intended processor.

4. The method of claim 1, wherein detecting the source code and decompressing the compressed data content further comprises receiving and decompressing data packet protocol consistent Signal Compression (SigComp) as part of a Third Generation Partnership Project (3GPP) packet data transport.

5. The method of claim 1, wherein the data content comprises multimedia or signaling content, further comprising presenting the data content in a form recognizable to a user.

6. The method of claim 1, further comprising wirelessly receiving the data packet communication.

7. The method of claim 1, further comprising receiving a Session Initiation Protocol/Session Description Protocol (SIP/SDP) data packet communication comprising the at least one message.

8. An apparatus for receiving compressed data content comprising:

a first executable version of a first decompression bytecode;

a decompressor dispatcher operable to detect a second decompression bytecode, received in a data packet communication channel with a compressed Internet Protocol (IP) Multimedia Subsystem (IMS) data content, wherein the apparatus is operable for SIP/SDP communication with a network device, wherein the decompressor dispatcher is operable to request and receive the second executable version of the second decompression bytecode in response to detecting the second decompression bytecode rather than the first decompression bytecode;

an optimized decompressor that executes the second executable version of the second decompression bytecode to process the compressed IMS data content into plain Session Initiation Protocol/Session Description Protocol (SIP/SDP) messages; and a local SIP/SDP application for receiving the plain SIP/SDP messages.

9. The apparatus of claim 8, further comprising a universal decompressor virtual machine (UDVM), wherein the decompressor dispatcher invokes the UDVM to interpret the decompression bytecode in response to failing to locate the second executable version of the second decompression bytecode.

10. At least one processor configured to communicate data content comprising:

a first module for detecting a source code in at least one message transferred via a data packet protocol, wherein the at least one message comprises compressed data content, wherein the compressed data content comprises data content compressed by a selected one of a plurality of compression algorithms;

a second module for locating an accessible executable version of a corresponding decompression algorithm associated with the detected source code, wherein the corresponding decompression algorithm is capable of reproducing the data content from the compressed data content; and a third module for decompressing the compressed data content utilizing the located accessible executable version of the corresponding decompression algorithm.

11. A computer program product, comprising:

a computer-readable medium comprising:

a first et of codes for causing a computer to detect a source code contained in at least one message, as part of a data packet protocol transmission also containing data content compressed by a selected one of a plurality of compression algorithms, each of the compression algorithms having a corresponding decompression algorithm capable of reproducing the data content from the compressed data content, the source code suitable for interpretation to perform the corresponding decompression algorithm by the computer;

a second set of codes for causing the computer to locate an accessible executable version of the corresponding decompression algorithm associated with the detected source code; and a third set of codes for causing the computer to decompress the compressed data content utilizing the located accessible executable version of the corresponding decompression algorithm.

12. An apparatus comprising:

means for detecting bytecode contained in a the Session Initiation Protocol/Session Description Protocol (SIP/SDP) data packet communication;

means for requesting an executable version of the detected source code from a remote entity;

means for receiving an executable version of the detected source code from a remote entity;

means for locating an accessible executable version of the corresponding decompression algorithm associated with the detected source code; and means for decompressing the compressed data content utilizing the located accessible executable version of the corresponding decompression algorithm.

13. An apparatus for disseminating Internet Protocol (IP) Multimedia Subsystem (IMS) data content to a communication device, the apparatus comprising:

a compressor that compresses the IMS data content with a compression algorithm;

a data structure containing a decompression bytecode;

a data packet communication channel that transmits the compressed IMS data content and decompression bytecode to the communication device; and a processor responsive to a request from the communication device to obtain and transmit an executable version of the decompression bytecode to the communication device.

14. The apparatus of claim 13, wherein the processor obtains a configuration of the communication device to select the executable version of the decompression bytecode appropriate for the communication device.

15. A method for disseminating Internet Protocol (IP) Multimedia Subsystem (IMS) data content to a communication device, comprising:

compressing the IMS data content with a compression algorithm;

generating a data structure containing a decompression bytecode;

transmitting the compressed IMS data content and decompression bytecode to the communication device; and transmitting an executable version of the decompression bytecode to the communication device responsive to a request from the communication device.

16. The method of claim 15, further comprising obtaining a configuration of the communication device to select the executable version of the decompression bytecode appropriate for the communication device.

17. At least one processor configured for disseminating Internet Protocol (IP) Multimedia Subsystem (IMS) data content to a communication device, comprising:

a first module for compressing the IMS data content with a compression algorithm;

a second module for generating a data structure containing a decompression bytecode;

a third module for transmitting the compressed IMS data content and decompression bytecode to the communication device: and a fourth module for transmitting an executable version of the decompression bytecode to the communication device responsive to a request from the communication device.

18. A computer program product comprising:

a computer readable medium, comprising:

a first set of codes operable to cause a computer to compress Internet Protocol (IP) Multimedia Subsystem (IMS) data content with a compression algorithm;

a second set of codes operable to cause the computer to generate a data structure containing a decompression bytecode;

a third set of codes operable to cause the computer to transmit the compressed IMS data content and decompression bytecode to the communication device; and a fourth set of codes operable to cause the computer to transmit an executable version of the decompression bytecode to the communication device responsive to a request from the communication device.

19. An apparatus for disseminating Internet Protocol (IP) multimedia Subsystem (IMS) data content to a communication device, comprising:

means for compressing the IMS data content with a compression algorithm;

means for generating a data structure containing a decompression bytecode;

means for transmitting the compressed IMS data content and decompression bytecode to the communication device; and means for transmitting an executable version of the decompression bytecode to the communication device responsive to a request from the communication device.

20. At least one processor configured to communicate data content comprising:

a first module for detecting a source code in at least one message transferred via a data packet protocol, wherein the at least one message comprises compressed data content, wherein the compressed data content comprises data content compressed by a selected one of a plurality of compression algorithms;

a second module for requesting an executable version of the detected source code from a remote entity;

a third module for receiving the executable version of the detected source code from the remote entity;

a fourth module for locating an accessible executable version of a corresponding decompression algorithm associated with the detected source code, wherein the corresponding decompression algorithm is capable of reproducing the data content from the compressed data content; and a fifth module for decompressing the compressed data content utilizing the located accessible executable version of the corresponding decompression algorithm.

21. A computer program product, comprising:

a computer-readable medium comprising:

a first set of codes for causing a computer to detect a source code in at least one message transferred via a data packet protocol, wherein the at least one message comprises compressed data content, wherein the compressed data content comprises data content compressed by a selected one of a plurality of compression algorithms;

a second set of codes the causing the computer to request an executable version of the detected source code from a remote entity;

a third set of codes for causing the computer to receive the executable version of the detected source code from the remote entity;

a fourth set of codes for causing the computer to locate an accessible executable version of a corresponding decompression algorithm associated with the detected source code, wherein the corresponding decompression al gun thin is capable of reproducing the data content from the compressed data content; and a fifth set of codes for causing the computer to decompress the compressed data content utilizing the located accessible executable version of the corresponding decompression algorithm.

22. A method of communicating data content, comprising:

detecting a source code in at least one message transferred via a data packet protocol, wherein the at least one message comprises compressed data content, wherein the compressed data content comprises data content compressed by a selected one of a plurality of compression algorithms;

attempting to locate an accessible executable version of a corresponding decompression algorithm associated with the detected source code, wherein the corresponding decompression algorithm is capable of reproducing the data content from the compressed data content;

compiling the detected source code into machine code in response to failing to locate an accessible executable version of a corresponding decompression algorithm associated with the detected source code;

creating a new accessible executable version of the corresponding decompression algorithm associated with the detected source code containing the machine code indexed by the detected source code; and decompressing the compressed data content utilizing the new accessible executable version of the corresponding decompression algorithm.

23. The method of claim 22, further comprising invoking a virtual machine to interpret the corresponding source code to decompress the compressed data content in response to failing to locate an accessible version of the corresponding decompression algorithm associated with the detected source code.

24. The method of claim 22, wherein detecting the source code and decompressing the compressed data content further comprises receiving and decompressing data packet protocol consistent Signal Compression (SigComp) as part of a Third Generation Partnership Project (3GPP) packet data transport.

25. The method of claim 22, wherein the data content compress multimedia or signaling content, further comprising presenting the data content in a form recognizable to a user.

26. The method of claim 22, further comprising wirelessly receiving the data packet communication.

27. The method of claim 22, further comprising receiving a Session Initiation Protocol/Session Description Protocol (SIP/SDP) data packet communication comprising the at least one message.

28. The method of claim 22, further comprising storing the new accessible executable version of the corresponding decompression algorithm, wherein the detecting further comprises detecting in an ensuing message received after the at least one message, wherein the attempting to locate results in locating the new accessible executable version of the corresponding decompression algorithm associated with the detected source code. and wherein the decompressing further comprises decompressing respective compressed data in the ensuing message.

29. At least one processor configured to communicate data content, comprising:

a first module for detecting a source code in at least one message transferred via a data packet protocol, wherein the at least one message comprises compressed data content, wherein the compressed data content comprises data content compressed by a selected one of a plurality of compression algorithms;

a second module for attempting to locate an accessible executable version of a corresponding decompression algorithm associated with the detected source code, wherein the corresponding decompression algorithm is capable of reproducing the data content from the compressed data content;

a third module for compiling the detected source code into machine code in response to failing to locate an accessible executable version of a corresponding decompression algorithm associated with the detected source code;

a fourth module for creating a new accessible executable version of the corresponding decompression algorithm associated with the detected source code containing the machine code indexed by the detected source code; and a fifth module for decompressing the compressed data content utilizing the new accessible executable version of the corresponding decompression algorithm.

30. A computer program product, comprising:

a computer-readable medium comprising:

a first set of codes for causing a computer to detect a source code in at least one message transferred via a data packet protocol, wherein the at least one message comprises compressed data content, wherein the compressed data content comprises data content compressed by a selected one of a plurality of compression algorithms;

a second set of codes for causing the computer to attempt to locate an accessible executable version of a corresponding decompression algorithm associated with the detected source code, wherein the corresponding decompression algorithm is capable of reproducing the data content from the compressed data content;

a third set of codes for causing the computer to compile the detected source code into machine code in response to failing to locate an accessible executable version of a corresponding decompression algorithm associated with the detected source code;

a fourth set of codes for causing the computer to create a new accessible executable version of the corresponding decompression algorithm associated with the detected source code containing the machine code indexed by the detected source code; and a fifth set of codes for causing the computer to decompress the compressed data content utilizing the new accessible executable version of the corresponding decompression algorithm.

31. An apparatus for communicating data content, comprising:

means for detecting a source code in at least one message transferred via a data packet protocol, wherein the at least one message comprises compressed data content, wherein the compressed data content comprises data content compressed by a selected one of a plurality of compression algorithms;

means for attempting to locate an accessible executable version of a corresponding decompression algorithm associated with the detected source code, wherein the corresponding decompression algorithm is capable of reproducing the data content from the compressed data content;

means for compiling the detected source code into machine code in response to failing to locate an accessible executable version of a corresponding decompression algorithm associated with the detected source code;

means for creating a new accessible executable version of the corresponding decompression algorithm associated with the detected source code containing the machine code indexed by the detected source code; and means tor decompressing the compressed data content utilizing the new accessible executable version of the corresponding decompression algorithm.

32. An apparatus for receiving compressed data content comprising:

a first executable version of a first decompression bytecode;

a decompressor dispatcher operable to detect a second decompression bytecode, received in a data packet communication channel with a compressed Internet Protocol (IP) Multimedia Subsystem (IMS) data content;

a compiler, wherein the decompressor dispatcher directs the compiler to generate a second executable version associated with the second decompression bytecode in response to detecting the second decompression bytecode rather than the first decompression bytecode;

an optimized decompressor that executes the second executable version of the second decompression bytecode to process the compressed IMS data content into plain Session Initiation Protocol/Session Description Protocol (SIP/SDP) messages; and a local SIP/SDP application for receiving the plain SIP/SDP messages.

33. The apparatus of claim 29, further comprising a universal decompressor virtual machine (UDVM), wherein the decompressor dispatcher invokes the UDVM to interpret the decompression bytecode in response to failing to locate the second executable version of the second decompression bytecode.

34. A method of communicating data content comprising:

detecting a source code in at least one message transferred via a data packet protocol, wherein the at least one message comprises compressed data content, wherein the compressed data content comprises data content compressed by a selected one of a plurality of compression algorithms;

invoking a proxy virtual machine in a first processor that sends instructions from the detected source code and the compressed data content to a second processor;

decompressing the compressed data content by the second processor based on the instructions from the proxy virtual machine; and presenting the data content decompressed by the second processor.

35. The method of claim 34, wherein detecting the source code and decompressing the compressed data content further comprises receiving and decompressing data packet protocol consistent Signal Compression (SigComp) as part of a Third Generation Partnership Project (3GPP) packet data transport.

36. The method of claim 34, wherein the data content comprises multimedia or signaling content, wherein presenting the data content further comprises presenting in a form recognizable to a user.

37. The method of claim 34, further comprising wirelessly receiving the data packet communication.

38. The method of claim 34, further comprising receiving a Session Initiation Protocol/Session Description Protocol (SIP/SDP) data packet communication comprising the at least one message.

39. At least one processor configured to communicate data content, comprising:

a first module for detecting a source code in at least one message transferred via a data packet protocol, wherein the at least one message comprises compressed data content, wherein the compressed data content comprises data content compressed by a selected one of a plurality of compression algorithms;

a second module for invoking a proxy virtual machine in a first processor that sends instructions from the detected source code and the compressed data content to a second processor;

a third module for decompressing the compressed data content by the second processor based on the instructions from the proxy virtual machine; and a fourth module for presenting the data content decompressed by the second processor.

40. A computer program product, comprising:

a computer-readable medium comprising:

a first set of codes for causing a computer to detect a source code in at least one message transferred via a data packet protocol, wherein the at east one message comprises compressed data content, wherein the compressed data content comprises data content compressed by a selected one of a plurality of compression algorithms;

a second set of codes for causing the computer to invoke a proxy virtual machine in a first processor that sends instructions from the detected source code and the compressed data content to a second processor;

a third set of codes for causing the computer to decompress the compressed data content by the second processor based on the instructions from the proxy virtual machine; and a fourth set of codes for causing the computer to present the data content decompressed by the second processor.

41. An apparatus for communication data content, comprising:

means for detecting a source code in at least one message transferred via a data packet protocol, wherein the at least one message comprises compressed data content, wherein the compressed data content comprises data content compressed by a selected one of a plurality of compression algorithms;

means for invoking a proxy virtual machine in a first processor that sends instructions from the detected source code and the compressed data content to a second processor;

means for decompressing the compressed data content by the second processor based on the instructions from the proxy virtual machine; and means for presenting the data content decompressed by the second processor.

42. An apparatus for receiving compressed data content, comprising:

a first executable version of a first decompression bytecode;

a decompressor dispatcher operable to detect a second decompression bytecode, received in a data packet communication channel with a compressed Internet Protocol (IP) Multimedia Subsystem (IMS) data content;

a proxy universal decompressor virtual machine (UDVM) operable to receive the decompression bytecode and generate instructions for programming a second executable version of the second decompression bytecode;

a hardware implemented UDVM interfaced to the proxy UDVM to receive the instructions for programming the second executable version of the second decompression bytecode;

wherein the hardware implemented UDVM comprises an optimized decompressor that executes the second executable version of the second decompression bytecode to proccss the compressed IMS data content into plain Session Initiation Protocol/Session Description Protocol (SIP/SDP) messages; and a local SIP/SDP application for receiving the plain SIP/SDP messages.

43. The apparatus of claim 29, further comprising a universal decompressor virtual machine (UDVM), wherein the decompressor dispatcher invokes the UDVM to interpret the decompression bytecode in response to failing to locate the second executable version of the second decompression bytecode.

* * * * *